United States Patent
Yilmaz et al.

(10) Patent No.: US 11,640,993 B2
(45) Date of Patent: May 2, 2023

(54) SHIELDED GATE TRENCH MOSFET DEVICES

(71) Applicants: IPOWER SEMICONDUCTOR, Gilroy, CA (US); Taiwan Semiconductor Co., Ltd., New Taipei (TW)

(72) Inventors: Hamza Yilmaz, Gilroy, CA (US); Jong Oh Kim, Portland, OR (US)

(73) Assignees: IPOWER SEMICONDUCTOR, Gilroy, CA (US); TAIWAN SEMICONDUCTOR CO., LTD., New Taipei (TW)

( * ) Notice: Subject to any disclaimer, the term of this patent is extended or adjusted under 35 U.S.C. 154(b) by 0 days.

(21) Appl. No.: 17/572,645

(22) Filed: Jan. 11, 2022

(65) Prior Publication Data
US 2022/0131000 A1   Apr. 28, 2022

Related U.S. Application Data

(60) Division of application No. 16/596,754, filed on Oct. 8, 2019, now Pat. No. 11,251,297, which is a
(Continued)

(51) Int. Cl.
*H01L 29/423* (2006.01)
*H01L 29/78* (2006.01)
*H01L 29/66* (2006.01)

(52) U.S. Cl.
CPC ...... *H01L 29/7813* (2013.01); *H01L 29/4236* (2013.01); *H01L 29/66734* (2013.01)

(58) Field of Classification Search
CPC ............. H01L 29/7813; H01L 29/4236; H01L 29/66734
See application file for complete search history.

(56) References Cited

U.S. PATENT DOCUMENTS

| | | |
|---|---|---|
| 5,219,777 A | 6/1993 | Kang |
| 8,816,431 B2 | 8/2014 | Bowers |

(Continued)

FOREIGN PATENT DOCUMENTS

WO    2019169361 A1    9/2019

OTHER PUBLICATIONS

PCT, International Search Report and Written Opinion of the International Searching Authority for International Application No. PCT/US2019/020441, dated May 23, 2019, 8 pages.

(Continued)

*Primary Examiner* — Samuel A Gebremariam
(74) *Attorney, Agent, or Firm* — Halit N. Yakupoglu

(57) ABSTRACT

A shielded gate trench MOSFET device structure is provided. The device structure includes MOS gate trenches and p body contact trenches formed in an n type epitaxial silicon layer overlying an n+ silicon substrate. Each MOS gate trench includes a gate trench stack having a lower n+ shield poly silicon layer separated from an upper n+ gate poly silicon layer by an inter poly dielectric layer. The upper and lower poly silicon layers are also laterally isolated at the areas where the lower poly silicon layer extends to silicon surface by selectively removing portion of the upper poly silicon and filling the gap with a dielectric material. The method is used to form both MOS gate trenches and p body contact trenches in self-aligned or non self-aligned shielded gate trench MOSFET device manufacturing.

6 Claims, 16 Drawing Sheets

Related U.S. Application Data continuation-in-part of application No. 16/414,769, filed on May 16, 2019, now Pat. No. 10,777,661, which is a continuation-in-part of application No. 16/290,834, filed on Mar. 1, 2019, now Pat. No. 10,998,438.

(60) Provisional application No. 62/637,274, filed on Mar. 1, 2018.

(56) References Cited

U.S. PATENT DOCUMENTS

| | | |
|---|---|---|
| 8,847,310 B1 | 9/2014 | Korec |
| 9,224,853 B2 | 12/2015 | Pan |
| 9,887,287 B1 | 2/2018 | Lichtenwalner et al. |
| 10,056,461 B2 | 8/2018 | Lui et al. |
| 10,777,661 B2 | 9/2020 | Yilmaz |
| 10,998,438 B2 | 5/2021 | Yilmaz |
| 11,251,297 B2 | 2/2022 | Yilmaz et al. |
| 2002/0036319 A1 | 3/2002 | Baliga |
| 2009/0096018 A1 | 4/2009 | Izumi |
| 2010/0190307 A1 | 7/2010 | Lee et al. |
| 2011/0254088 A1 | 10/2011 | Darwish et al. |
| 2012/0248530 A1 | 10/2012 | Lui et al. |
| 2016/0020288 A1 | 1/2016 | Deng et al. |
| 2016/0126348 A1 | 5/2016 | Deng et al. |
| 2016/0172482 A1 | 6/2016 | Bobde et al. |
| 2017/0330964 A1 | 11/2017 | Siemieniec et al. |
| 2019/0273152 A1 | 9/2019 | Yilmaz |
| 2019/0273157 A1 | 9/2019 | Yilmaz |
| 2022/0130999 A1 | 4/2022 | Yilmaz et al. |
| 2022/0131000 A1 | 4/2022 | Yilmaz et al. |
| 2022/0131001 A1 | 4/2022 | Yilmaz et al. |

OTHER PUBLICATIONS

PCT, International Search Report and Written Opinion of the International Searching Authority for International Application No. PCT/US2019/032757, dated Aug. 16, 2019, 9 pages.

SHIELDED GATE TRENCH MOSFET DEVICES

CROSS REFERENCE TO RELATED APPLICATIONS

This application is a divisional application of U.S. patent application with Ser. No. 16/596,754 filed on Oct. 8, 2019, which is a continuation in part of U.S. patent application with Ser. No. 16/414,769 filed on May 16, 2019, now U.S. Pat. No. 10,777,661, which is a continuation in part of U.S. patent application with Ser. No. 16/290,834 filed on Mar. 1, 2019, now U.S. Pat. No. 10,998,438, which relates to and claims priority from U.S. provisional patent application Ser. No. 62/637,274 filed on Mar. 1, 2018, which are expressly incorporated by reference herein in their entirety.

BACKGROUND

Field of the Invention

The present invention relates to semiconductor devices, more particularly, to device structures and methods of forming trench metal oxide semiconductor field effect transistor (MOSFET) devices.

Description of the Related Art

In power metal oxide semiconductor field effect transistor (MOSFET) devices, as the resistance per square area is kept decreasing due to the availability of new structures, advanced process techniques and tools, die sizes for MOSFET products are also getting smaller and smaller. There are several challenges to be addressed in advanced trench MOSFET products with smaller die sizes, for example: (1) increasing thermal resistance of the smaller die, (2) increasing robustness of the MOSFETs to handle much higher current density under unclamped inductive, high dv/dt and diode recovery mode of operations compared to low performing larger die area type power MOSFETs, and (3) minimizing Rds and Cgd variations due to large variation of Inter Poly Oxide(IPO) thickness.

Manufacturing thinner dies and improved power device packaging can address the thermal resistance related issues in power MOSFET devices. Improving the robustness of power MOSFET devices in smaller dies includes, for example, (1) providing structures and processes to localize breakdown in the middle of the MOSFET body, (2) ensuring device avalanche breakdown to occur in the active device cells (MOSFETs) rather than the termination areas, (3) keeping extremely low p body to source shorting resistance to prevent turn on of parasitic NPN bipolar transistor of the MOSFET. Mask misalignment of a non-self-aligned p body contact to trench causes an increased shorting resistance between the p body and the n+ source of the MOSFET. Therefore, there is a need for new processes to form p+ body contact structures to minimize the adverse effect of the non-self-aligned p body contacts

SUMMARY

An aspect of the present invention includes a method for forming shielded gate trench MOSFET devices, including: providing a silicon layer having n type conductivity overlying a semiconductor substrate; forming, on a front surface of the silicon layer, a plurality of gate trenches in an active region of the front surface, the gate trenches extending orthogonally from the front surface toward the semiconductor substrate; forming in each gate trench a gate trench stack including: forming a shield layer lining side walls and bottom wall of each gate trench, wherein the shield layer is silicon oxide; forming a first doped poly silicon layer on a portion of the shield layer lining the bottom wall and lower portions of the side walls of the gate trench; removing upper portions of the shield layer to expose upper portions of the side walls; forming a first film of an inter poly oxide (IPO) layer on the first doped poly silicon layer, the first film of the IPO layer being a poly silicon oxide (PSO) film; forming a second film of the inter poly oxide (IPO) layer on the first film of the IPO layer, the second film of the IPO layer being a silicon oxide film; forming an undoped poly silicon (UPS) layer on the second film of the IPO layer; forming a protection layer continuously and conformally coating the upper portions of the side walls and the UPS layer, the protection layer being a silicon oxide layer; removing only a portion of the protection layer coating the UPS layer using reactive ion etching while retaining portions of the protection layer on the upper portions of the side walls; etching the UPS layer by a silicon etching process; etching the protection layer left on the side walls by a silicon oxide etching; growing a gate oxide layer on the upper portions of the side walls; and forming a second doped poly silicon layer on the gate oxide layer and the IPO layer; forming p body regions and n+ source regions extending between the gate trenches; and forming a dielectric layer on the front surface.

Another aspect of the present invention includes a method for forming shielded gate trench MOSFET devices, including: providing a silicon layer having an n type conductivity overlying a semiconductor substrate; forming, on a front surface of the silicon layer, a plurality of gate trenches in an active region of the front surface, the gate trenches extending orthogonally from the front surface toward the semiconductor substrate; forming in each gate trench a gate trench stack including: forming a shield layer lining side walls and bottom wall of each gate trench, wherein the shield layer is silicon oxide; forming a first doped poly silicon layer on a portion of the shield layer lining the bottom wall and lower portions of the side walls of the gate trench; removing upper portions of the shield layer to expose upper portions of the side walls; forming an inter poly oxide (IPO) layer including a poly silicon oxide film on the first doped poly silicon layer; depositing undoped poly silicon on the IPO layer; etching down the undoped polysilicon to form an undoped poly silicon (UPS) layer on the IPO layer; removing any silicon oxide from the side walls formed during the forming of the IPO layer by a silicon oxide etching; forming a protection layer continuously and conformally coating the upper portions of the side walls and the UPS layer, the protection layer being a silicon oxide layer; removing only a portion of the protection layer coating the UPS layer using reactive ion etching while retaining portions of the protection layer on the upper portions of the side walls; removing the UPS layer; etching the protection layer left on the side walls by a silicon oxide etching; growing a gate oxide layer on the upper portions of the side walls; and forming a second doped poly silicon layer on the gate oxide layer and the IPO layer; forming p body regions and n+ source regions extending between the gate trenches; and forming a dielectric layer on the front surface.

Another aspect of the present invention includes a method for forming shielded gate trench MOSFET devices, including: providing a silicon layer having n type conductivity overlying a semiconductor substrate; forming, on a front surface of the silicon layer, a plurality of gate trenches in an active region of the front surface, the gate trenches extending orthogonally from the front surface toward the semiconductor substrate; forming in each gate trench a gate trench stack including: forming a shield layer lining side walls and bottom wall of each gate trench, wherein the shield layer is silicon oxide; forming a first doped poly silicon layer on a portion of the shield layer lining the bottom wall and lower portions of the side walls of the gate trench; removing upper portions of the shield layer to expose upper portions of the side walls; forming a first film of an inter poly oxide (IPO) layer, which is a poly silicon oxide film, on top of the first doped poly silicon layer, by applying an oxidation process, the oxidation process also results in forming a silicon oxide layer on the upper portions of the side walls; forming a second film of the inter poly oxide (IPO) layer on the first film of the IPO layer, which is a silicon oxide film, by first depositing a silicon oxide film on both the first film and the silicon oxide layer, patterning the silicon oxide film with a photoresist layer so as to only expose the portions of the silicon oxide film on the silicon oxide layer, and etching portions of the silicon oxide film and the silicon oxide layer on the upper portions of the side walls, removing the photoresist layer to expose the IPO layer; growing a gate oxide layer on the upper portions of the side walls; and forming a second doped poly silicon layer, on the gate oxide layer and the IPO layer, filling the gate trench; forming p body regions and n+ source regions extending between the gate trenches; and forming a dielectric layer on the front surface.

Another aspect of the present invention includes a method for forming shielded gate trench MOSFET devices, including: providing a silicon layer having n type conductivity overlying a semiconductor substrate; forming, on a front surface of the silicon layer, a plurality of gate trenches in an active region of the front surface, the gate trenches extending orthogonally from the front surface toward the semiconductor substrate; forming in each gate trench a gate trench stack including: forming a shield layer lining side walls and bottom wall of each gate trench, wherein the shield layer is silicon oxide; forming a first doped poly silicon layer on a portion of the shield layer lining the bottom wall and lower portions of the side walls of the gate trench; removing upper portions of the shield layer to expose upper portions of the side walls; forming an inter poly oxide (IPO) layer, including a poly silicon oxide film, on top of the first doped poly silicon layer, wherein forming of the IPO layer results in forming silicon oxide on upper portions of the side walls; depositing photoresist on the IPO layer; etching down the photoresist to form a photoresist layer on the IPO layer; removing any silicon oxide from the side walls formed during the forming of the IPO layer by a silicon oxide etching; removing the photoresist layer to expose the IPO layer; growing a gate oxide layer on the upper portions of the side walls; and forming a second doped poly silicon layer, on the gate oxide layer and the IPO layer, filling the gate trench; forming p body regions and n+ source regions extending between the gate trenches; and forming a dielectric layer on the front surface.

Another aspect of the present invention includes a method for forming shielded gate trench MOSFET devices, including: providing a silicon layer having n type conductivity overlying a semiconductor substrate; forming, on a front surface of the silicon layer, an array of a plurality of gate trenches and p body contact trenches in an active region of the front surface, the gate trenches and the contact trenches extending orthogonally from the front surface toward the semiconductor substrate; and forming in each gate trench a gate trench stack including: forming a shield layer lining side walls and bottom wall of each gate trench, wherein the shield layer is silicon oxide; forming a first doped poly silicon layer on a portion of the shield layer lining the bottom wall and lower portions of the side walls of the gate trench; removing upper portions of the shield layer to expose upper portions of the side walls; forming an inter poly oxide (IPO) layer, including a poly silicon oxide film, on top of the first doped poly silicon layer, wherein forming of the IPO layer results in forming silicon oxide on upper portions of the side walls; depositing photoresist on the IPO layer; etching down the photoresist to form a photoresist layer on the IPO layer; removing any silicon oxide from the side walls formed during the forming of the IPO layer by a silicon oxide etching; removing the photoresist layer to expose the IPO layer; growing a gate oxide layer on the upper portions of the side walls; and forming a second doped poly silicon layer, on the gate oxide layer and the IPO layer, filling the gate trench; forming p body regions and n+ source regions extending between the gate trenches; forming a dielectric layer on the front surface; forming body contact trenches via a contact mask; forming p+ body regions by low energy ion implantation of B or $BF_2$ ions through the body contact trenches; and forming a top metal layer for source electrodes and gate electrodes.

Another aspect of the present invention provides a method for forming shielded gate trench MOS devices, including: providing a silicon layer having a first type conductivity overlying a semiconductor substrate; forming, on a front surface of the silicon layer, an array of a plurality of gate trenches in an active region of the front surface, the gate trenches and the contact trenches extending orthogonally from the front surface toward the semiconductor substrate; and forming in each gate trench a gate trench stack including: forming a shield layer lining side walls and bottom wall of each gate trench, wherein shield layer is silicon oxide; forming a first doped poly silicon layer on a portion of the shield layer lining the bottom wall and lower portions of the side walls of the gate trench; removing upper portions of the shield layer to expose upper portions of the side walls; forming an inter poly oxide (IPO) layer including a poly silicon oxide film, on top of the first doped poly silicon layer by a thermal oxide growth process, wherein forming of the IPO layer results in forming silicon oxide layer on upper portions of the side walls; depositing a high density plasma (HDP) oxide layer on the oxide layer and the IPO layer to further thicken IPO layer, wherein a thickness ratio of the HDP oxide layer on the side walls to on the IPO layer is about 1/5; removing the HDP oxide and the silicon oxide from the trench side walls using wet etching while retaining the HDP oxide over the IPO layer and portions of the HDP oxide layer and the silicon oxide layer on the front surface; forming a photoresist layer by filling cavity above the IPO layer; etching back the photoresist layer immediately below the front surface to expose the portions of the HDP oxide layer and the silicon oxide layer on the front surface; removing the portions of the HDP oxide layer and the silicon oxide layer from the front surface and subsequently removing the photoresist to expose the IPO layer; growing a gate oxide layer on the upper portions of the side walls; and forming a second doped poly silicon layer, on the gate oxide layer and the IPO layer, filling the gate trench.

Yet another aspect of the present invention includes a method for forming shielded gate trench MOSFET devices, including: providing a silicon layer having n type conductivity overlying a semiconductor substrate; forming, on a front surface of the silicon layer, a plurality of gate trenches in an active region of the front surface, the gate trenches extending orthogonally from the front surface toward the semiconductor substrate; and forming in each gate trench a gate trench stack including: forming a shield layer lining side walls and bottom wall of each gate trench, wherein shield layer is silicon oxide; forming a first doped poly silicon layer on the shield oxide layer lining the bottom wall and the side walls of the gate trench; forming a cavity, having a side walls and a bottom wall, within the first doped poly silicon layer so that at least one edge portion of the first doped poly silicon layer extends to the front surface; forming an inter poly oxide (IPO) including silicon oxide on the bottom wall of the first doped poly silicon layer; forming a gate oxide layer on the side walls of the first doped poly silicon layer; forming a second doped poly silicon layer on the IPO layer lining the bottom wall and the gate oxide layer lining the side walls of the first doped poly silicon layer; reducing the thickness of the second poly silicon layer; patterning and etching the second poly silicon layer so as to form a gap between an edge of the second poly silicon layer and the first poly silicon layer; and filling the gap and coating top of the second poly silicon layer with a dielectric material.

DETAILED DESCRIPTION

Figure 1:
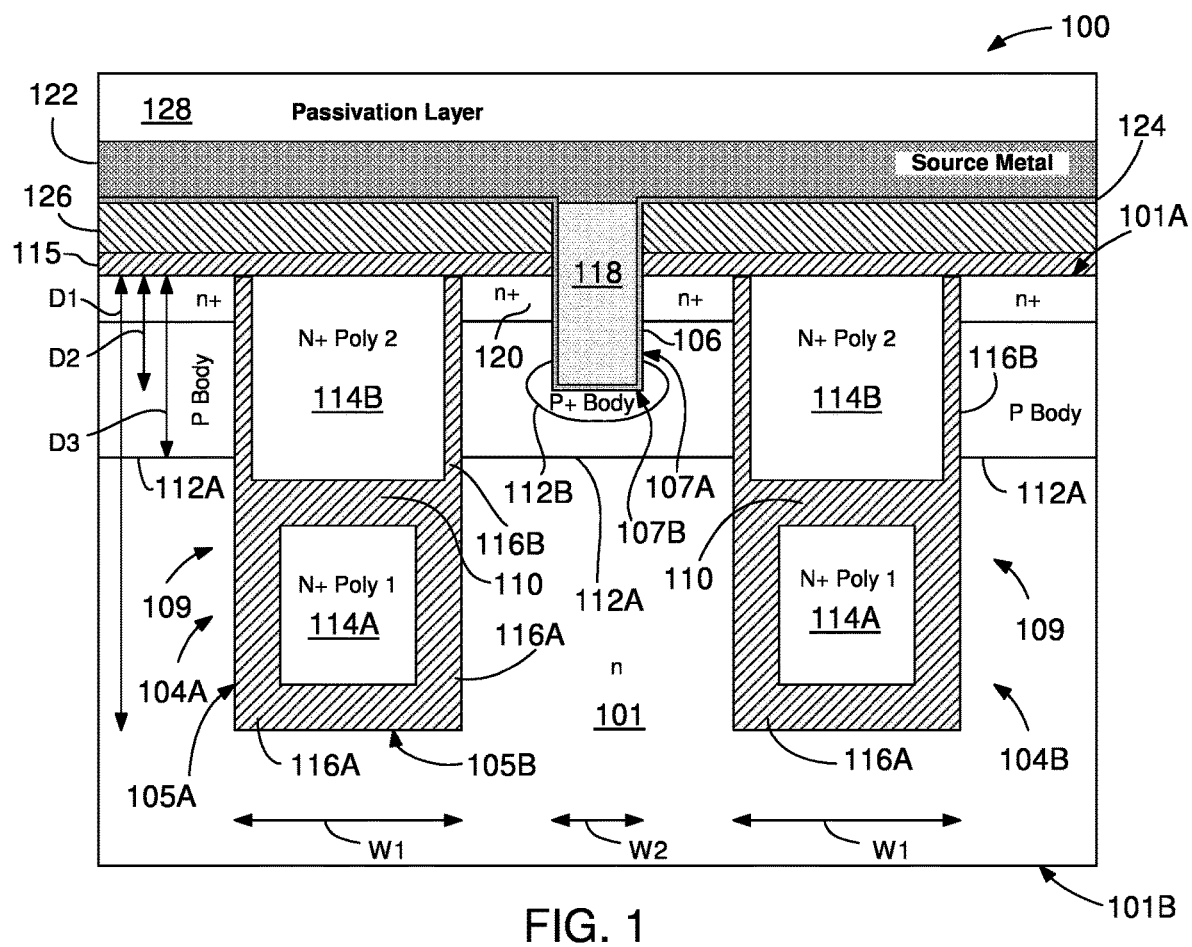
FIG. 1 is a schematic illustration of an embodiment of the present invention including a shielded gate trench (SGT) MOSFET device structure.

In addition to robustness improvements of the power MOSFET devices, embodiments of the present invention concern with methods of forming dielectric layers between doped poly silicon layers for semiconductor devices such as shielded gate trench (SGT) MOSFET devices and other semiconductor devices. Such layers may be referred to as inter poly dielectric layers, inter poly silicon dielectric layers (IPD layers), or inter poly silicon oxide (IPO) layers. IPD and IPO terms may be used interchangeably throughout this application to refer to inter poly silicon dielectrics.

In MOS gate trenches of the SGT MOSFET device structures, thickness variations in the IPO layer between the shield poly silicon layer (poly 1), located approximately at the bottom half of the trench, and the gate poly silicon layer (poly 2), located approximately at the upper half of the trench, may cause unwanted variations in the drain to source resistance (Rds) and the gate to drain capacitance (Cgd). Embodiments of the present invention may include methods and structures for manufacturing gate trench IPO layers having minimized thickness variations.

Conventionally, after the shield poly silicon deposition, the silicon oxide ($SiO_2$) layer, as shield oxide layer, on the side walls of the MOS gate trench above the shield poly silicon layer may be removed and an IPO layer may be formed on the shield poly silicon layer by partially oxidizing it during the gate oxide layer forming step, which also forms a gate oxide layer on the exposed portions of the trench side walls. Although silicon oxide may grow relatively thicker on the poly silicon than the single crystal silicon side walls, the IPO layer grown over the shield poly silicon during the gate oxide forming stage may not be thick enough to meet Vgs-max rating reliably. That is why in such conventional techniques, for example for manufacturing split gate or shielded gate type MOSFET structures, after the shield poly silicon deposition step and the following etch down process step, additional silicon oxide may be deposited to fill the gate trench. This additional silicon oxide filling the gate trench is then planarized and etched down to form an IPO layer that is about 1.5 to 5 times thicker than the gate oxide. In this conventional process, thickness variations in the IPO may be very large, because the final IPO thickness may vary due to depth variations of MOS gate trenches and etch back variations of the shield poly silicon as well as etch back variations of the deposited silicon oxide.

As opposed to the conventional techniques, embodiments of the present invention may provide a thicker IPO formation method on top of the shield poly silicon layer with minimal IPO thickness variation. Since the IPO growth or deposition starts at the surface of the shield poly silicon layer in the MOS gate trench, the process may be more repeatable with less than about 5% variation and without being impacted from the trench depth and shield poly silicon etch variations.

Accordingly, in one embodiment, the present invention provides a trench MOSFET device including an array of a plurality of metal-oxide semiconductor (MOS) gate trenches, or gate trenches, and p body contact trenches, or contact trenches, formed on a semiconductor wafer. The semiconductor wafer may be a silicon wafer comprising an epitaxial silicon top layer formed on a silicon substrate. The gate trenches and contact trenches may be disposed in an alternating fashion in an active region on a top surface of the wafer and extending orthogonally into the wafer. The depth and the width of the contact trenches may be smaller than the depth and the width of the gate trenches. The contact trenches are disposed inside a p body region adjacent the gate trenches. A heavily doped p+ body region located at the bottom of the contact trenches may be in electrical contact with a source electrode of the MOSFET device via a portion of a contact material, or contact electrode, e.g., a metal filling, of the contact trench.

In one embodiment, each gate trench may include a gate trench stack formed by a process of the present invention. The gate trench stack may include a first doped poly silicon layer separated from a second doped poly silicon layer by an inter poly dielectric layer, or inter poly oxide layer, that is formed in accordance with a process of the present invention.

Figure 2A:
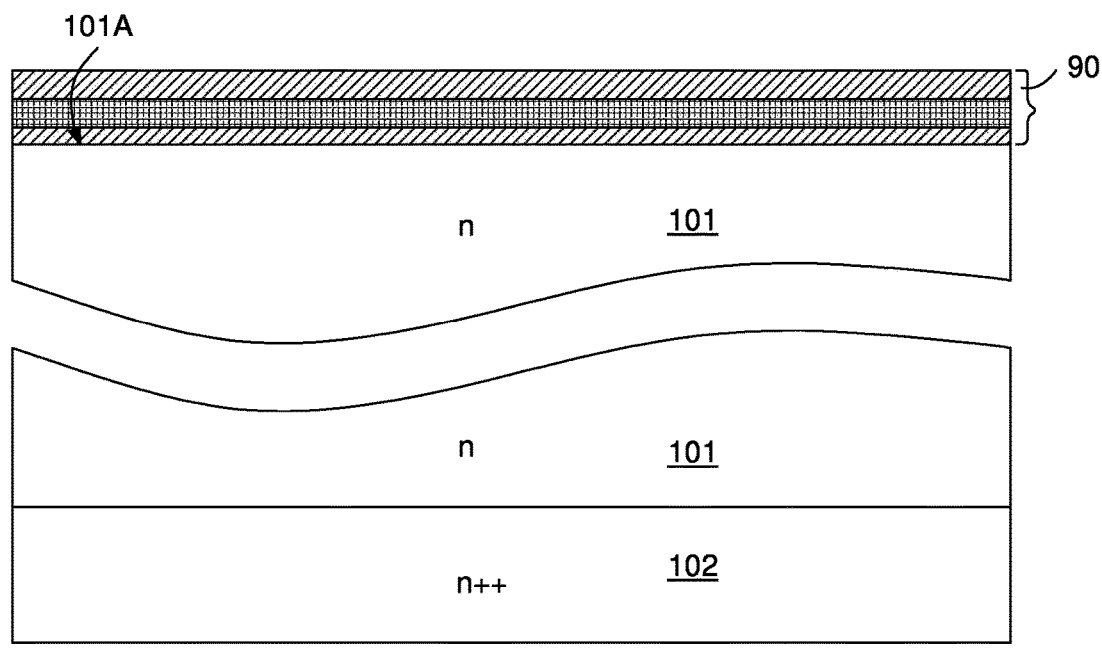
FIGS. 2A-2D are schematic illustrations of an exemplary embodiment of forming gate trenches prior to forming of gate trench stacks.

FIG. 1 illustrates, in schematic cross-sectional view, an embodiment of an active cell structure in a shielded gate trench MOSFET device structure 100 including a semiconductor layer 101 having a front surface 101A or a top surface 101A, and a back surface 101B which may overlie a semiconductor substrate 102 (FIG. 2A). The top surface 101A may be the front surface or the mesa surface of the semiconductor layer 101. The semiconductor layer 101 and the semiconductor substrate 102 may be just a small exemplary portion of a larger die (not shown) or wafer that may include the exemplary active cell structure shown in FIG. 1. Semiconductor structures and active cell regions described in this disclosure may be formed on the same die using various processes using the same or different masking steps.

In one embodiment, the semiconductor layer 101 may be an epitaxial (epi) single crystal silicon layer grown over the semiconductor substrate. The semiconductor layer 101 may have a first type of conductivity, or n type of conductivity, i.e., doped with n type of dopants, such as arsenic (As) ions or phosphor (P) ions. The semiconductor substrate may also have n type of conductivity; however, it is doped with an n type of dopant concentration higher than the n dopant concentration of the semiconductor layer 101, which is denoted with n++ to indicate its high n dopant concentration.

The semiconductor layer 101 may include an array of a plurality of MOS gate trenches 104 and p body contact trenches 106 formed in an alternating fashion in an active area 108 of the MOSFET device 100, and extending orthogonally toward the back surface 101B from the top surface 101A. In the following disclosure, MOS gate trenches will be referred to as gate trenches 104 and the p body contact trenches will be referred to as contact trenches 106. For clarity, figures in this disclosure generally show only two gate trenches 104, a first gate trench 104A and a second gate trench 104B, located at both sides of the contact trench 106. A shielded gate trench MOSFET device may include a plurality of gate trenches and contact trenches disposed in an alternating fashion, i.e., an order of "gate trench/contact trench/gate trench/contact trench/ . . . ", in an active area of the device.

Referring back to FIG. 1, the gate trenches 104 and the contact trench 106 are rectangular in cross-section formed in the semiconductor layer 101 by patterning and etching the top surface 101A. The trenches 104 and 106 may extend parallel to one another along the front surface 101A of the semiconductor layer 101. During the process of forming them, the gate trenches 104 and the contact trenches 106 may or may not be self-aligned in the semiconductor layer 101, i.e., the measured distance separating each gate and contact trench in the array may be the same or different. In one embodiment of the present invention, the contact trenches 106 may be formed after the completion of the gate trench stacks 109 in the gate trenches 104.

The gate trenches 104 may be defined by side walls 105A and a bottom wall 105B, and the contact trenches 106 may be defined by side walls 107A and a bottom wall 107B. The contact trench 106 may be symmetrically positioned between the gate trenches 104, i.e., self-aligned manner. The gate trenches 104 may have a first depth denoted with D1 and a first width denoted with W1. The contact trenches 106 may have a second depth denoted with D2 and a second width denoted with W2. In one embodiment, D1 may be greater than D2, and W1 may be greater than W2. In another embodiment, D1/2 may be greater than D2, and W1/2 may be greater than W2. The first depth D1 may be in the range of about 1-10 microns and the second depth D2 may be in the range of about 0.3-1 micron. The first width W1 may be in the range of about 0.4-2 microns and the second width W2 may be in the range of about 0.15-0.3 microns.

Referring back to FIG. 1, a first contact region 112A or, a first p body contact region (p body), having a second type conductivity, or p type conductivity, may be formed by implanting p type dopants, such as boron (B) ions, to the semiconductor layer 101 through the top surface 101A. The first contact region 112A may have a rectangular cross section and formed in a portion of the semiconductor layer 101 between the gate trenches 104. The first contact region 112A may have a depth D3 measured from the top surface 101A. The depth D3 of the first contact region 112A may be less than the first depth D1 of the gate trench 104 and greater than the second depth D2 of the contact trench 106. An exemplary depth D3 for the first contact region 112A may be in the range of about 0.3-1.0 micron.

As mentioned above, the gate trenches 104 may include gate trench stacks 109 filling the trench cavities. Each gate trench stack 109 may include a first poly silicon layer 114A (shield poly silicon), separated from a second poly silicon layer 114B (gate poly silicon) by an inter poly dielectric layer 110. In one embodiment, the first poly silicon layer 114A may fill a bottom half of the gate trench 104 and the second poly silicon layer 114B may fill the upper half of the gate trench 104. In one embodiment, the inter poly dielectric layer 110 may be an inter poly silicon oxide layer 110 formed in accordance with a process of the present invention. The inter poly silicon oxide layer 110, or inter poly oxide layer 110, will be referred to as IPO layer 110, hereinafter. In one embodiment, a shield oxide ($SiO_2$) layer 116A may be formed on a bottom half of the side walls and the bottom wall of the gate trench 104. The shield oxide layer 116A and the IPO layer 110 may electrically insulate the first poly silicon layer 114A. A gate oxide ($SiO_2$) layer 116B may be formed on an upper half of the side walls of the gate trench 104. The gate oxide layer 116B and the IPO layer 110 may electrically insulate the second poly silicon layer 114B.

In one embodiment, both the first poly silicon layer 114A and the second poly silicon layer 114B may be doped with n type dopants, thus including n+ poly silicon material (n+ poly). This arrangement of poly silicon layers in insulated gate trenches may be called double poly or shielded gate trench structures including n+ poly 1 (first n+ poly silicon layer) and n+ poly 2 (second n+ poly silicon layer). Shielded gate trench MOSFET structures may yield low drain to gate capacitance for faster switching of the MOSFET device.

Referring back to FIG. 1, a second contact region 112B, or the second p body contact region (p+ body), may be formed under the contact trench 106 by implanting dopants of the second type of conductivity through the bottom wall 107B of the contact trench 106. The second contact region 112B may be doped with a p type dopant ion concentration higher than the p type dopant ion concentration of the first contact region 112A, which is denoted with p+. The second contact region 112B may be in contact with a contact conductor 118 filling the contact trench 106 and may include an elliptically curved border expanding from the bottom wall 107B and extending symmetrically in the direction of the gate trenches and the back surface 101B from the bottom wall. The second contact region 112B may be disposed about a symmetry center between two neighboring gate trenches 104A and 104B.

Referring back to FIG. 1, the source contact regions 120 adjacent the front surface 101A may extend between the contact trench 106 and the gate trenches 104 located at both sides of the contact trench 106. The source contact regions 120 (source regions) may be doped with high doses of n type of dopant ions, and thus they will be referred to as n+ source contact regions or n+ source regions.

In one process embodiment, the contact trenches 106 may be formed after forming the first contact regions 112A and the source contact regions 120 by etching the semiconductor layer 101 having the first contact regions 112A and the source contact regions 120 between the gate trenches 104. In another process embodiment, the contact trenches 106 may be formed together with the gate trenches and plugged with an oxide ($SiO_2$) plug throughout the process of forming the gate trench stacks 104, the first contact regions 112A and the source contact regions 120. The oxide plug is removed after the formation of the first contact regions 112A and the source contact regions 120. In both process embodiments, the second contact regions 112B may be formed implantation through the contact trenches 106.

A contact conductor 118 filling the contact trench 106 may be a part of a buffer layer 124 (the buffer metal). A source electrode 122 (source metal), may be in contact with the source contact regions 120, the first contact region 112A and the second contact region 112B by the buffer layer 124 extending through a dielectric layer 126 and into the contact trenches 106. An exemplary dielectric layer 126 may be a composite layer having an undoped silicon oxide layer and a borophosphosilicate glass (BPSG) layer on top of the undoped silicon oxide layer. The undoped silicon oxide layer may form a diffusion barrier between the BPSG layer and the top surface 101A of the semiconductor layer 101 as well as the adjacent oxide layers such as a surface layer 115. The surface layer 115, or the surface oxide layer 115, may be located between the top surface 101A and the dielectric layer 126. A passivation layer 128 may coat the source electrode 122. The buffer layer 124 may be a layer of Ti/TiN/W which prevents aluminum spike into silicon and damaging shallow p body to drain junction. The contact conductor 118 may include W. The source electrode 122 may be one of a layer of Al:Cu:Si, a layer of Al:Si or a layer of Al:Cu.

Embodiments of exemplary processes to form the gate trench stacks and the IPO layers 110 therein shown in the SGT MOSFET device structure 100 of FIG. 1 will be described below with respect to FIGS. 2A-2D, 3A-3B, 4A-4N, 5A-5D and 6A-6D.

FIGS. 2A-2D show processing with a first mask (M1 mask) to form the gate trenches 104 prior to forming of the gate trench stack 109 (FIG. 1) in the gate trenches.

FIG. 2A shows the semiconductor layer 101, which may be an n type epitaxial layer (epitaxial silicon layer) formed on a substrate layer 102, which may be a n++ type or n+ type silicon substrate, or wafer. Figures are not to scale and, after FIG. 2A, the substrate 102 will not be shown for clarity purposes. The substrate layer 102 may have a thickness of greater than 500 μm. In one embodiment, the thickness of the semiconductor layer 101, for example, for 20-400V MOSFET devices, may be in the range of about 2 to 40 μm. Before the etching process, a hard mask stack 90 including an oxide ($SiO_2$) layer, a nitride ($Si_3N_4$) layer, and another oxide ($SiO_2$) layer, which is known as ONO layer, may be formed on the top surface 101A of the semiconductor layer 101. Each oxide ($SiO_2$) layer in the hard mask stack 90 may have about 0.3-1 μm thickness and the nitride layer may have about 0.05-0.3 μm thickness. Alternatively, a single silicon oxide layer with 0.5-1.5 μm thickness, without a nitride layer, may also be used as hard mask.

Figure 2B:
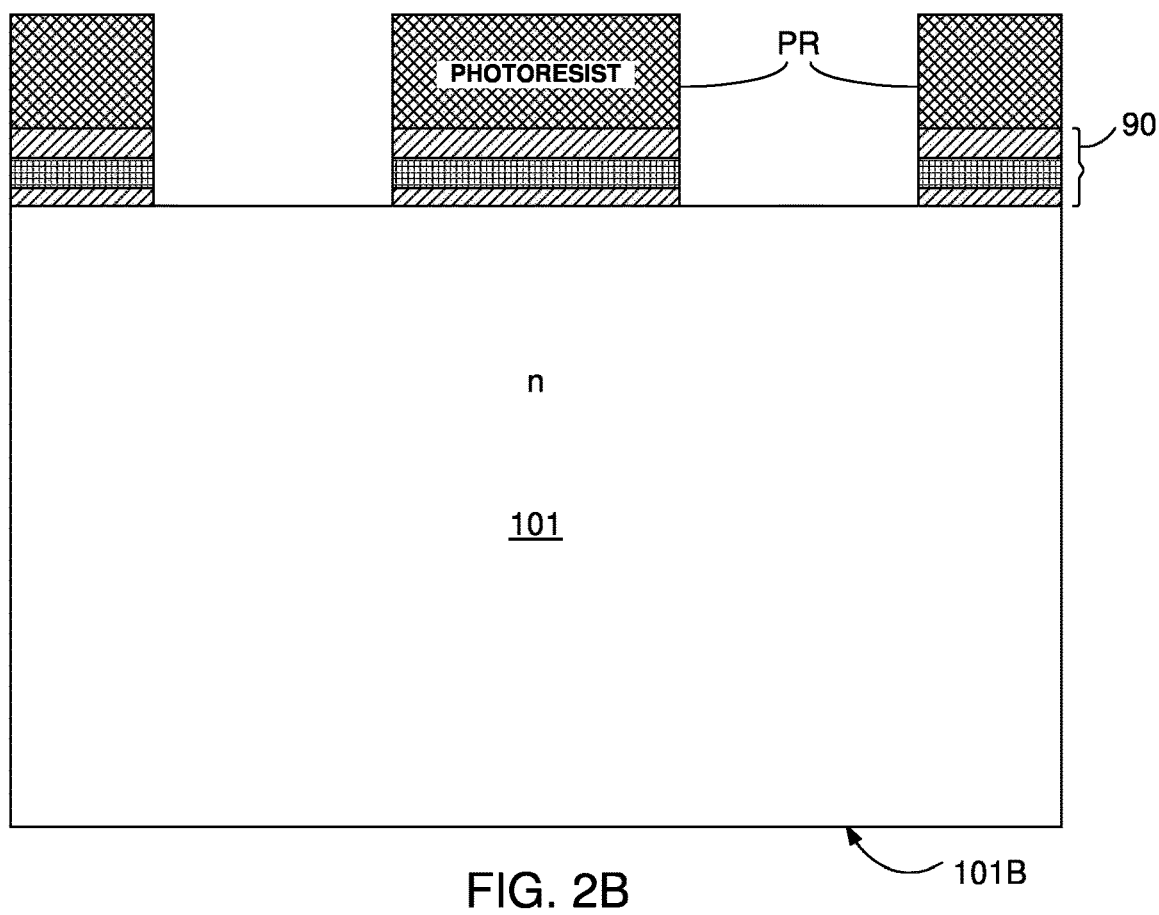
Figure 2C:
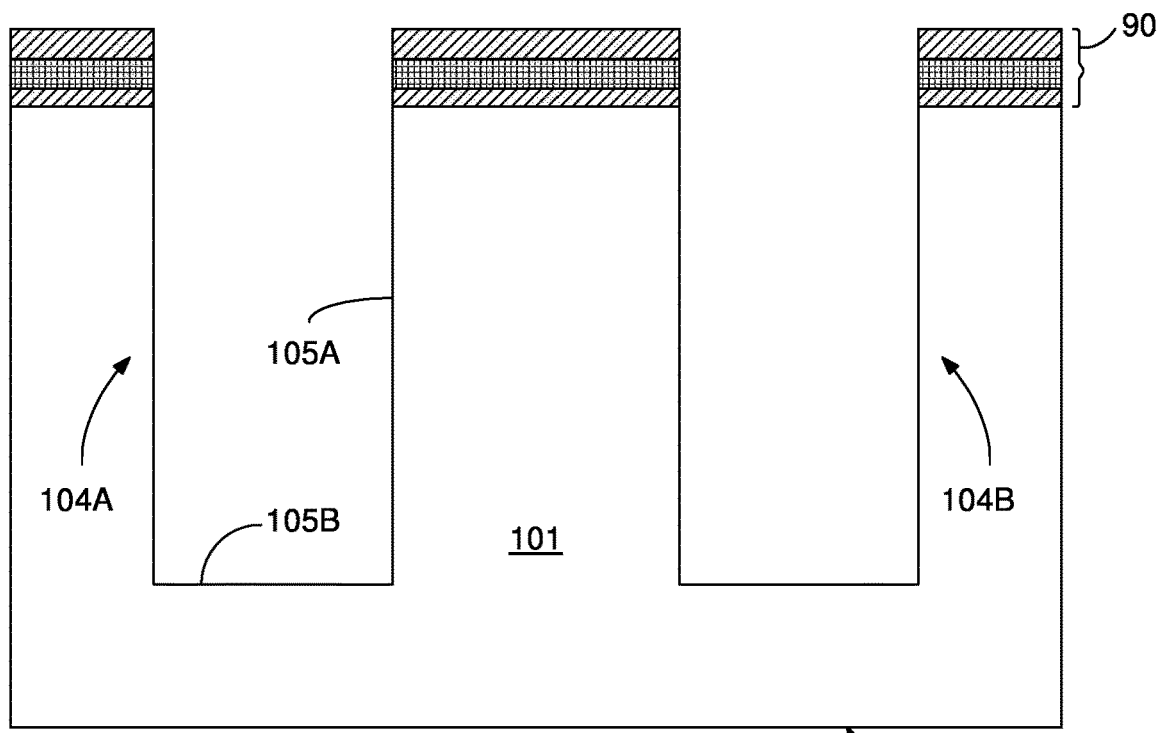

FIG. 2B shows a process for forming the gate trenches 104 using a first mask (M1 mask) which is the gate trench mask. A photoresist mask PR in FIG. 2B, may be used to define gate trench regions on the hard mask 90 so that the semiconductor layer 101 may be etched down through the defined hard mask 90 to form the gate trenches 104A and 104B, as shown in FIG. 2C. The etching process may form rectangular cavities of the gate trenches 104 which is defined by the side walls 105A and the bottom wall 105B. After the etching process, the gate trenches 104 may have a depth of about 0.3-0.7 μm and a width of about 0.3-1.2 μm. The distance between the gate trenches 104 may be in the range of about 0.3-1 μm.

Figure 2D:
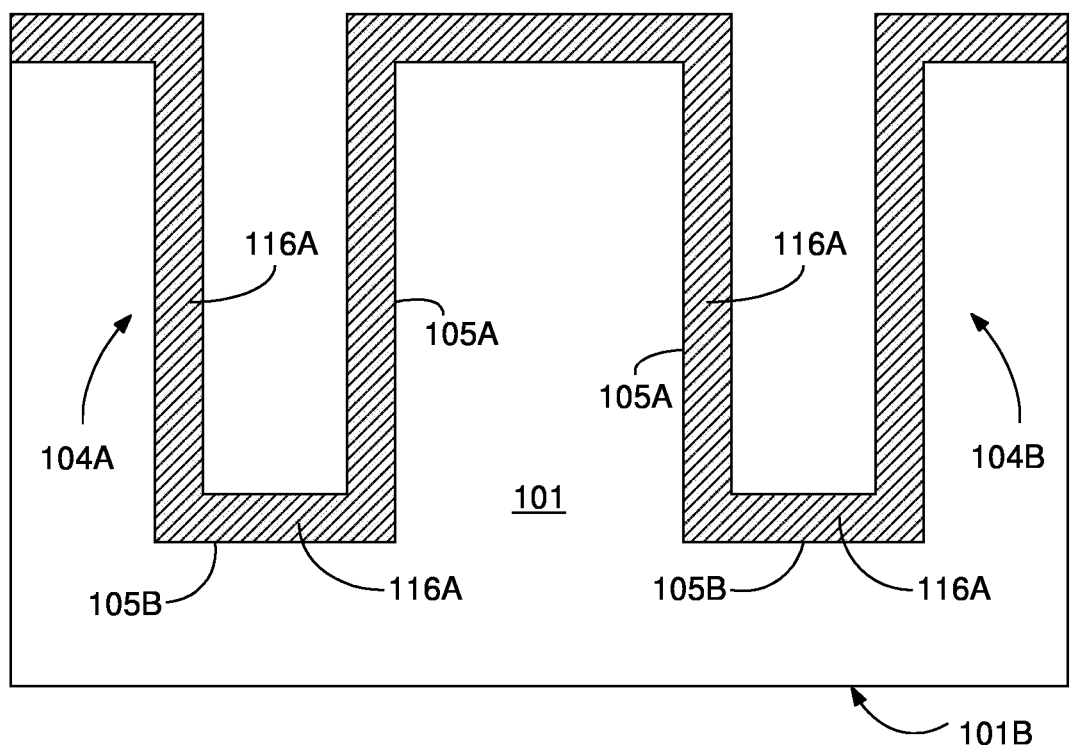

As shown in FIG. 2D, after removing the hard mask stack 90, a gate trench oxide layer 116A, or a trench oxide layer 116A, may be thermally grown or deposited on the side walls 105A and the bottom wall 105B of the gate trenches 104. The trench oxide layer 116A may be a $SiO_2$ layer having a thickness in the range of about 50-500 nanometers (nm). The trench oxide layer 116A may conformally and continuously coat the side walls 105A and the bottom wall 105B of the gate trenches 104.

Figure 3A:
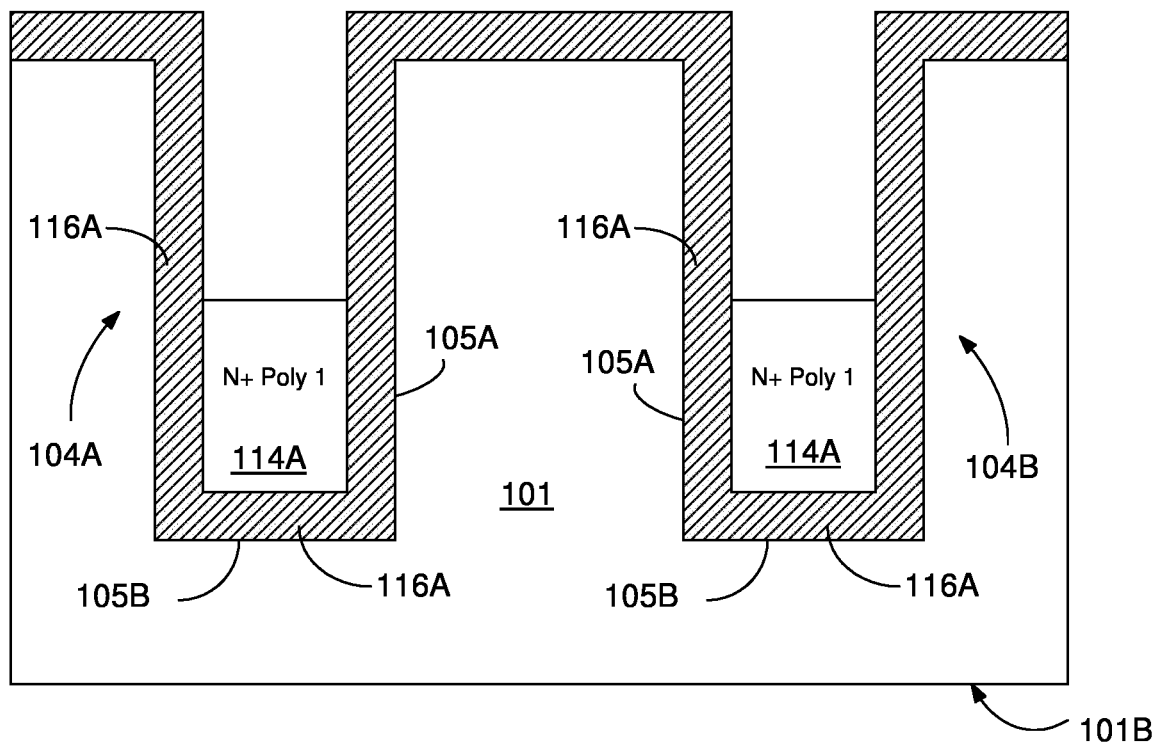
FIGS. 3A-3B are schematic illustrations of exemplary embodiments of forming of shield poly silicon layers of gate trench stacks.

FIG. 3A shows processing with a second mask (M2 mask) to form the first poly silicon layer 114A in the gate trenches 104 after forming the trench oxide layer 116A in the gate trenches and on the top surface 101A of the semiconductor layer 101. Poly silicon material (n+ doped poly silicon) may be deposited over the top surface 101A of the semiconductor layer 101 including the gate trenches 104 and etched back to form the first poly silicon layer 114A in the gate trenches 104 lined with the trench oxide layer 116A. The poly silicon material may be just etched back, or first planarized using CMP (chemical mechanical polishing) and then etched back, to form the first poly silicon layer 114A having a targeted thickness within the gate trenches 104. An exemplary thickness for the first poly silicon layer 114A may be in the range of about 0.3-1 μm. The first poly silicon layer 114A may be etched back to the target thickness using Mask 2. In one embodiment, the target thickness of the first poly silicon layer 114A may preferably be within the bottom half of the gate trenches 104. However, in other embodiments, the target thickness may be within the upper half of the gate trenches.

Figure 3B:
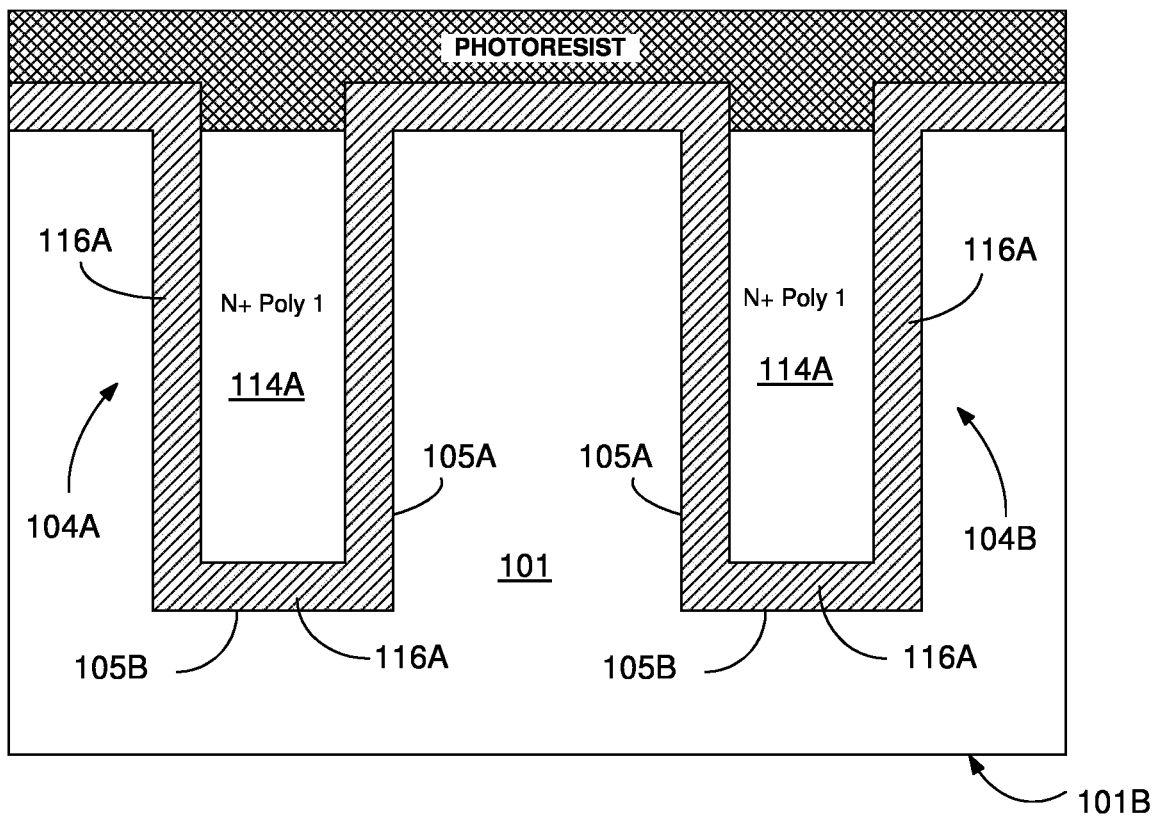

Referring to FIG. 3B, alternatively, some gate trenches 104 may be filled with the first poly silicon material, on the processed wafer, may be blocked by Mask 2 to form alternative structures.

Figure 4A:
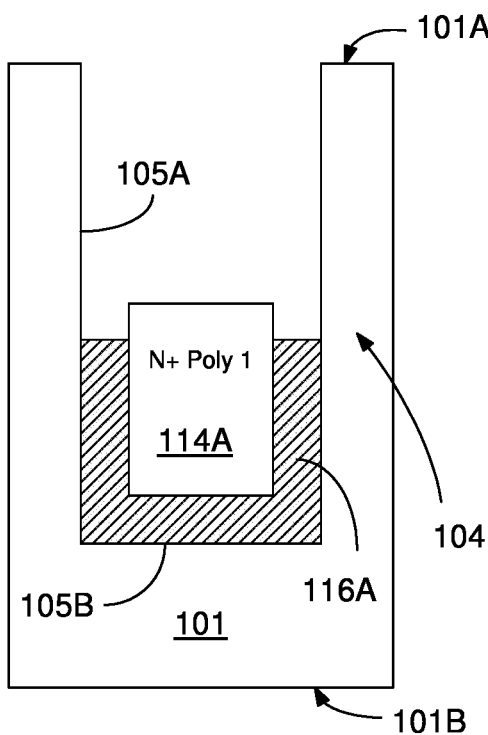
FIGS. 4A-4N are schematic illustrations of an exemplary embodiment of forming the gate trench stacks including inter poly dielectric (IPO) layers and gate poly silicon layers.
Figure 4B:
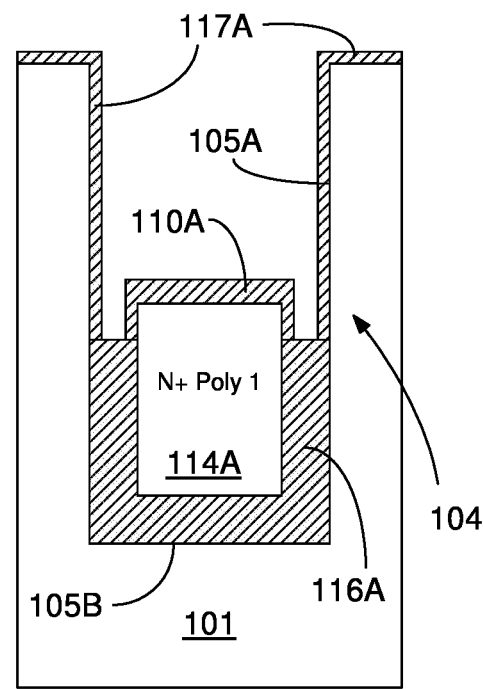
Figure 4C:
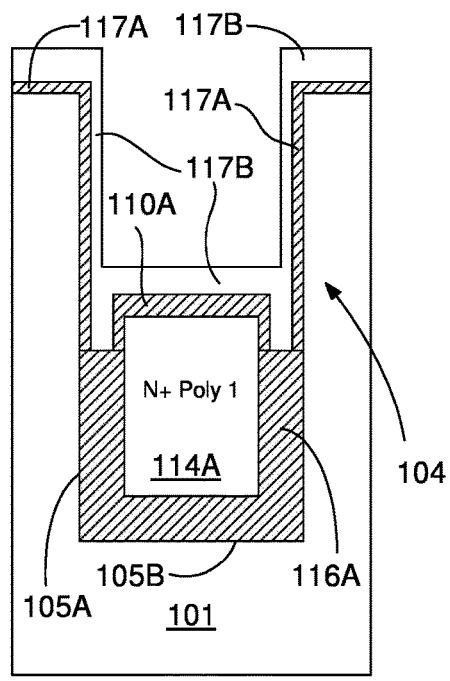
Figure 4D:
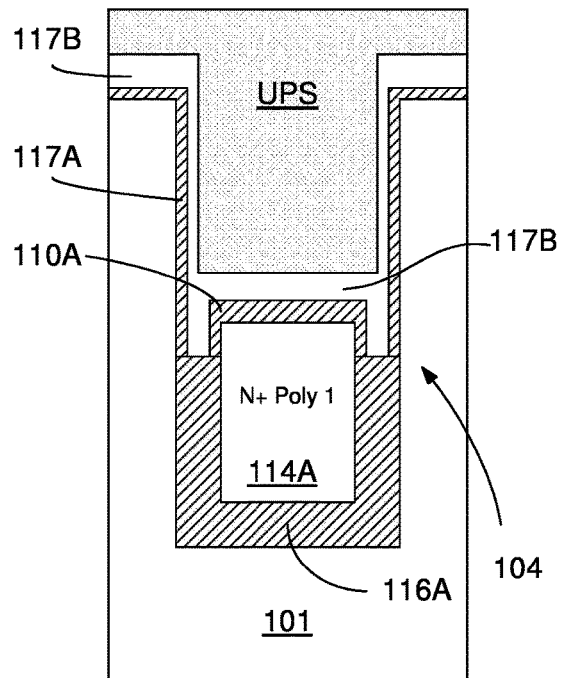
Figure 4E:
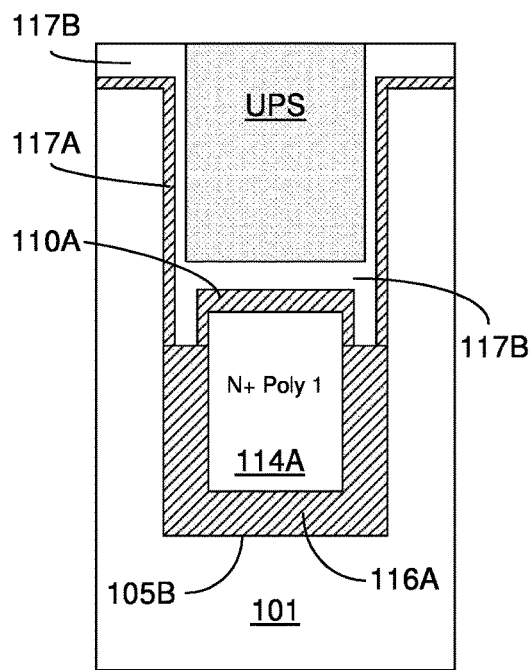
Figure 4F:
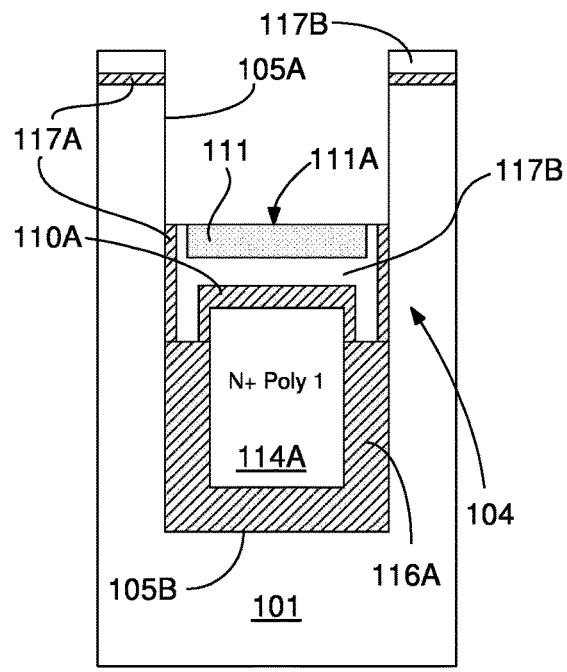
Figure 4G:
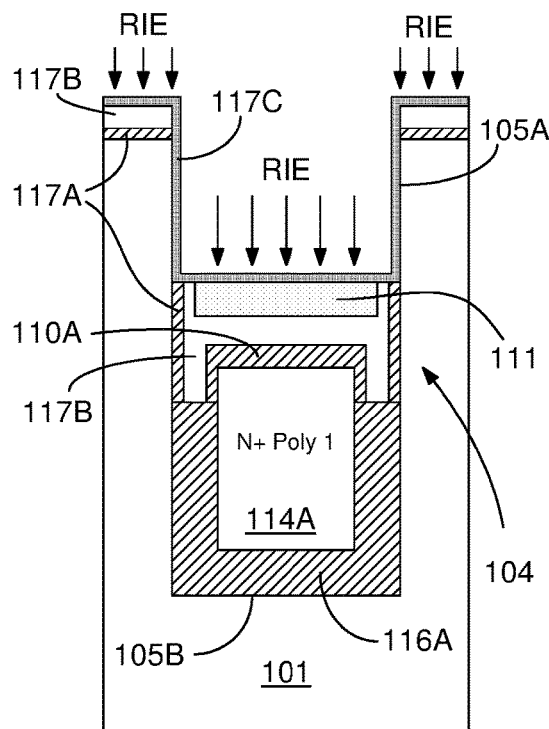
Figure 4H:
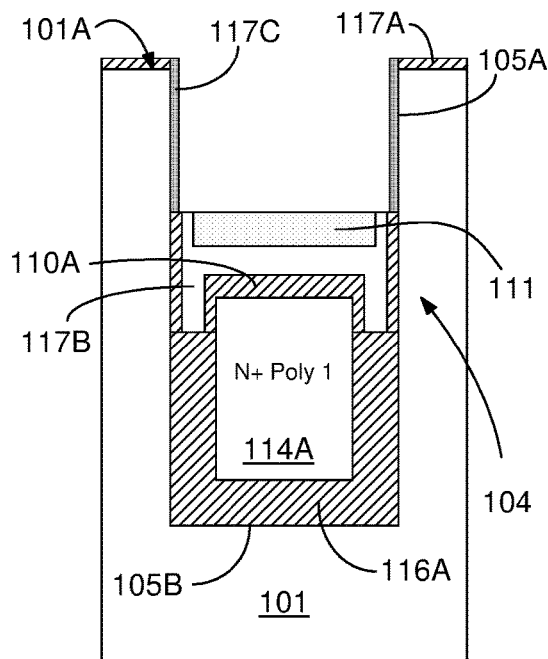
Figure 4I:
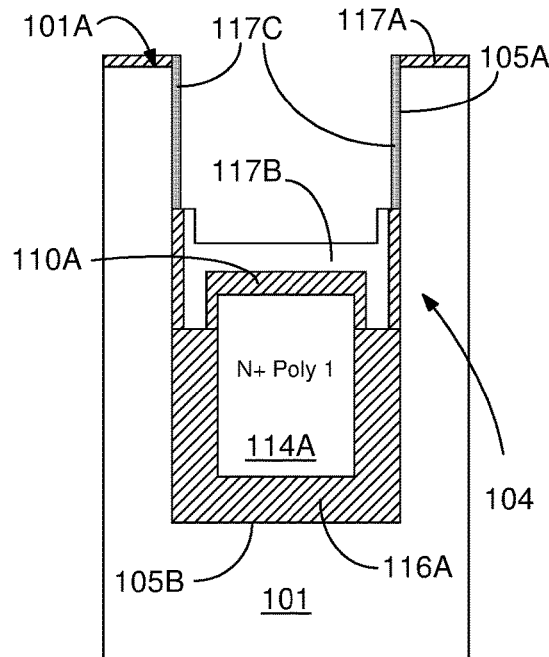
Figure 4J:
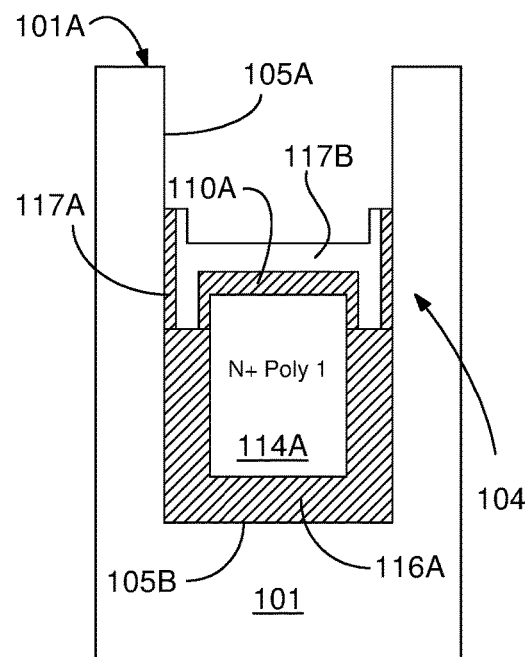
Figure 4K:
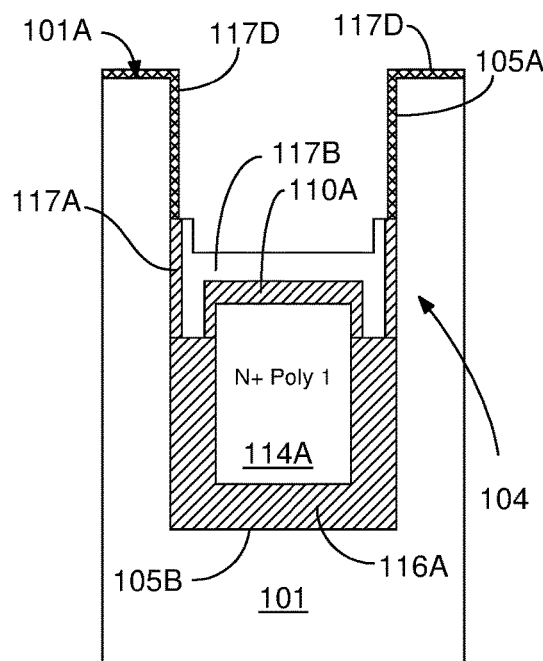
Figure 4L:
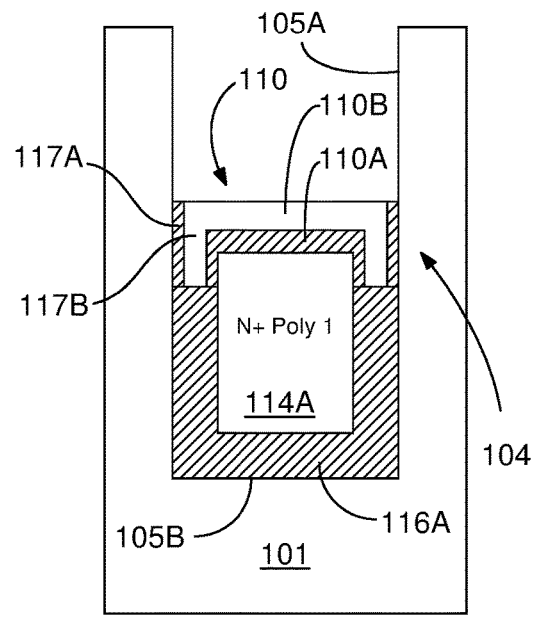
Figure 4M:
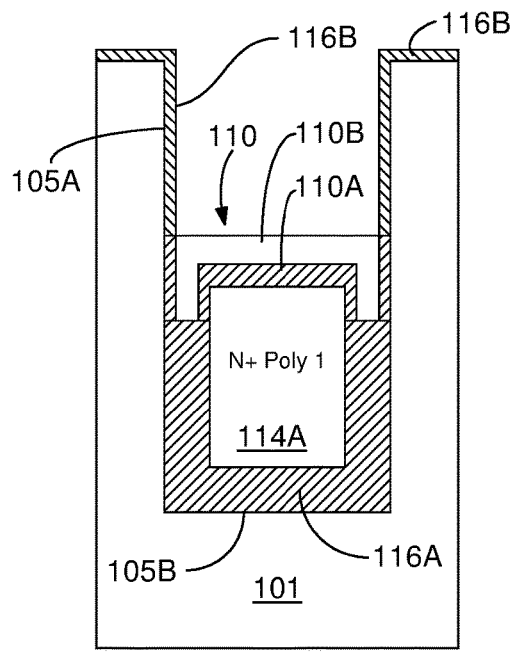
Figure 4N:
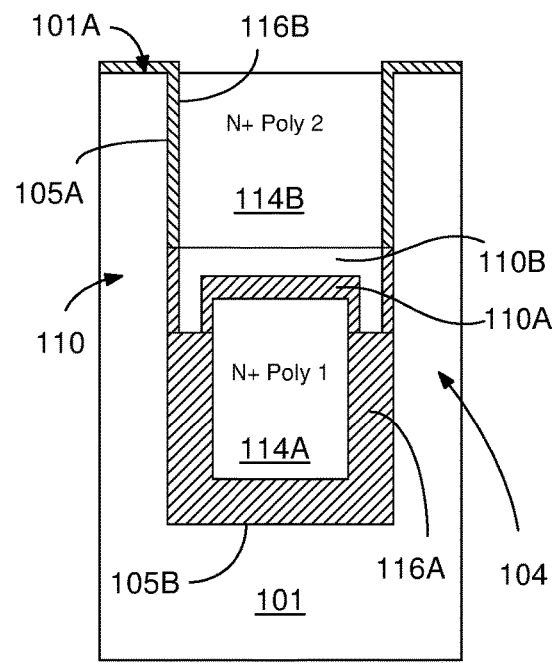

FIGS. 4A-4N show a process embodiment of forming the gate trench stack 109 including the inter poly oxide 110 (IPO layer) of the present invention. The IPO layer 110 may be comprised of a dielectric ($SiO_2$) bilayer, including a poly silicon oxide layer or film and a silicon oxide layer or film. The IPO layer 110 is interposed between the first poly silicon layer 114A and the second poly silicon layer 114B of the gate trench stack 109 (FIG. 1). In some process embodiments below, for clarity, the processing of the gate trench stack and the IPO layer 110 will be described on a single gate trench 104.

Referring to FIG. 4A, after the deposition and etch back steps to form the first poly silicon layer 114A, as shown in FIG. 3A, portions of the trench oxide layer 116A on the trench side walls 105A, which are generally extending between the first poly silicon layer 114A and the top surface 101A, may be removed by a silicon oxide etching process. This oxide etching process may expose silicon material of the upper portions of trench side walls 105A. Depending on the oxide etching process, the remaining portion of the trench oxide layer 116A on the side walls 105A may or may not be coplanar with top surface of the first poly silicon layer 114A. In this embodiment, the trench oxide layers 116A on the side walls 105A may be kept shorter and may not be coplanar with the top surface of the first poly silicon layer 114A.

Referring to FIG. 4B, in the next process step, a poly silicon oxide cap layer 110A may be formed on top of the first poly silicon layer 114A by an oxidation process called pad oxidation. The poly silicon oxide cap layer 110A is the first layer or film of the IPO layer 110 (FIG. 1) and will be referred to as poly silicon oxide (PSO) layer 110A hereinafter. The pad oxidation process transforms a top portion of the first poly silicon layer 114A into the PSO layer 110A the IPO layer 110. Together with the PSO layer 110A, the same pad oxidation process may also form an oxide layer, which will be referred to as the first oxide layer 117A (first $SiO_2$ layer), on the exposed silicon portions of the side trench walls 105A and on the top surface 101A of the semiconductor substrate 101. The PSO layer 110A and the first oxide layer 117A may have a thickness in the range of about 20-30 nm. In one example, the PSO layer 110A and the first oxide layer 117A may be about 20 nm thick.

Referring to FIG. 4C, in the next process step, a second oxide layer 117B (second $SiO_2$ layer) may be formed on the PSO layer 110A and the first oxide layer 117A as well as any exposed portions of the trench oxide layer 116A. The second oxide layer 117B may be deposited using either a thermal oxidation process or high density plasma (HDP) silicon oxide deposition process. If the second oxide layer 117B is grown by a thermal oxidation process, it may be a conformal and continuous layer having a thickness in the range of about 30-100 nm. In this embodiment, the second oxide layer 117B may preferably be deposited using HDP deposition process. The HDP deposited oxide may not have a uniform thickness, which may be thicker on the top surface 101A and over the PSO layer 110A but thinner on the first oxide layer 117A on the side walls 105A. A ratio of HDP oxide deposition over the side walls (vertical deposition, i.e., toward the top surface 101A) and the PSO layer 110A may be in the range of about 1:4 to 1:6.

As will be shown more fully below, a second layer 110B or film of the IPO layer 110 will be formed from a portion of the second oxide layer 117B covering the PSO layer 110A, when the process of forming the IPO layer 110 is completed. HDP silicon oxide deposition may be preferred for resulting thinner oxide layers on the vertical surfaces, however other deposition processes may also be used to form the second oxide layer 117B.

Referring to FIG. 4D, after forming the second oxide layer 117B, an undoped poly silicon (UPS) material may be deposited on the second oxide layer 117B. The UPS material may coat the top surface 101A and fill the trench cavity lined with the second oxide layer 117B. The undoped poly silicon material may have a smaller grain size than the doped poly silicon. Small grain size of the undoped poly silicon may provide a smooth and flat surface finish for the UPS layer 111.

Referring to FIGS. 4E-4F, in the following process step, the UPS material may be planarized and reduced to a thickness range of about 100 nm to form the UPS layer 111 over the PSO layer 110A. The UPS layer 111 is a sacrificial layer to protect the portion of the second oxide layer 117B, coating the PSO layer 110A, from the etchants used to etch $SiO_2$ during the following process steps. After forming the UPS layer 111 using a poly silicon etching process step, an oxide ($SiO_2$) etching process may be conducted to remove both the first oxide layer 117A and the second oxide layer 117B from the trench side walls 105A, thereby exposing the silicon material of the trench side walls 105A. The oxide etching process may remove portions of the first oxide layer 117A and the second oxide layer 117B on the trench side walls 105A and extending above a top surface 111A of the UPS layer 111, as shown in FIG. 4F. In this configuration, upper ends of remaining portions of the first and second oxide layers 117A and 117B on the side walls 105A may be coplanar with the planarized surface 111A of the UPS layer 111. At the end of this oxide etching process, remaining portions of the first and second oxide layer 117A and 117B on the top surface 101A may have thickness in the range of about 30-50 nm.

Referring to FIG. 4G, after forming the UPS layer 111 and the following oxide etching process, a third oxide layer 117C may be formed conformally coating the UPS layer 111 and the exposed portions of the trench side walls 105A and the remaining portions of the first and second oxide layers 117A, 117B on the top surface 101A. The third oxide layer 117C may have a thickness in the range of about 20-30 nm and may be formed to protect the trench side walls 105A from the silicon etchants used during the removal of the UPS layer 111. In order to expose the UPS layer 111 for the subsequent polysilicon etching process, a Reactive Ion Etching (RIE) process may be used to remove the portion of the third oxide layer 117C covering the UPS layer 111 and the portions of the third oxide layer 117C and the second oxide layer 117B on the top surface 101A. Referring to FIG. 4G, the RIE process is depicted with arrows directed to the horizontal portions of the third oxide layer 117C. During the RIE process, the portions of the third oxide layer 117C on the trench side walls are not etched.

Referring to FIGS. 4H-4J, in the following process steps, the UPS layer 111 may be removed using a poly silicon etch step, which exposes the second oxide layer 117B covering the PSO layer 110A. During the poly silicon etching process remainders of the third oxide layer 117C on the side walls and the first oxide layer 117A on the top surface 101A may protect the silicon surfaces underneath. After the removal of UPS layer 111, the remainders of the third oxide layer 117C and the first oxide layer 117A are removed from the trench side walls 105A and the top surface 101A respectively. Since HDP deposited second oxide layer 117B may be formed thicker at the top surface 101A and on top of the PSO layer 110A than the portions of the second oxide layer on the trench side walls 105A, after the etching of the oxide layers 117A and 117C, remaining second oxide layer 117B on top of the PSO layer 110A will still be thick enough.

Referring to FIG. 4K in the following process step, a fourth oxide layer 117D may be formed on the exposed silicon portions of the trench side walls 105A and on the top surface 101A, which is subsequently removed using a silicon oxide etch process The fourth oxide layer 117D may be a sacrificial oxide layer. The sacrificial oxide layer 117D may have a predetermined thickness in the range of about 20-30 nm, which is used to smooth trench side walls 105A for the subsequent gate oxide growth process. During the removal of the sacrificial oxide layer 117D, the second oxide layer 117B on the PSO layer 110A and the remainder of the first oxide layer 117A may be further etched and planarized, as shown in FIG. 4L. This sacrificial oxide etching step may reduce the thickness of the second oxide layer 117B by the same predetermined thickness of the sacrificial oxide layer 117D. Referring to FIG. 4L, this resulting portion of the second oxide layer 117B on the PSO layer 110A forms the second layer 110B of the IPO layer 110 of the present invention, which completes the formation of IPO layer 110 of the gate trench stack 109 (FIG. 1). The PSO layer 110A and the silicon oxide layer 110B form the first film 110A and the second film 110B of the IPO layer 110 of the present invention.

Referring to FIG. 4M, in the next process step, a gate oxide layer 116B may be formed on the exposed surfaces of the gate trench side walls 105A and on the top surface 101A. The gate oxide layer 116B may have a thickness in the range of 10-150 nm and smoothly continues, without any gaps, from the IPO layer 110 on and the remainder of the trench oxide layer 116A surrounding the first poly silicon layer 114A. The trench oxide layer 116A surrounding the first poly silicon layer 114A together with the IPO layer 110 is the shield oxide layer 116A of the gate trench stack 109. The gate oxide layer 116B may be grown thermally and may include a few percent chlorine to prevent drifting of the threshold voltage in the MOSFET device.

Referring to FIG. 4N, once the gate oxide layer 116B is grown on upper portion of the side walls 105A, the second poly silicon layer 114B may be formed in the cavity of the gate trench 104 defined by the IPO layer 110 on the first poly silicon layer 114A and the gate oxide layers 116B on the side walls 105A. During the process, poly silicon material may be deposited on the top surface 101A to fill the gate trenches 104 and cover the top surface 101A of the semiconductor layer 101. In the next step, the poly silicon material may be either planarized using a CMP process or etched back to form the second poly silicon layer 114B in the gate trenches 104. The formation of the second poly silicon layer 114B may complete the structure of the gate trench stack 109 having the IPO layer 110 of the present invention.

Figure 5A:
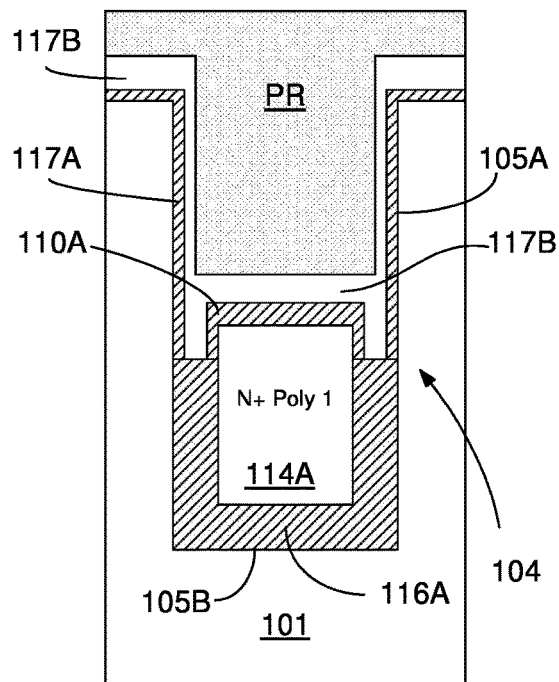
FIGS. 5A-5D are schematic illustrations of another exemplary embodiment of forming the gate trench stacks including inter poly dielectric (IPO) layers and gate poly silicon layers.

FIGS. 5A-5D show an alternative process embodiment of forming the gate trench stack 109 including the inter poly silicon oxide dielectric layer 110 (IPO layer) of the present invention. FIG. 5A of this embodiment shows a process step after the process step shown in FIG. 4C of the previous embodiment. After forming the second oxide layer 117B with HDP process, differing from the undoped poly silicon material (UPS) of the previous embodiment, a photoresist (PR) may be deposited on the second oxide layer 117B lining the trench cavity. The photoresist may coat the top surface 101A and fill the trench cavity coated by the second oxide layer 117B.

Figure 5B:
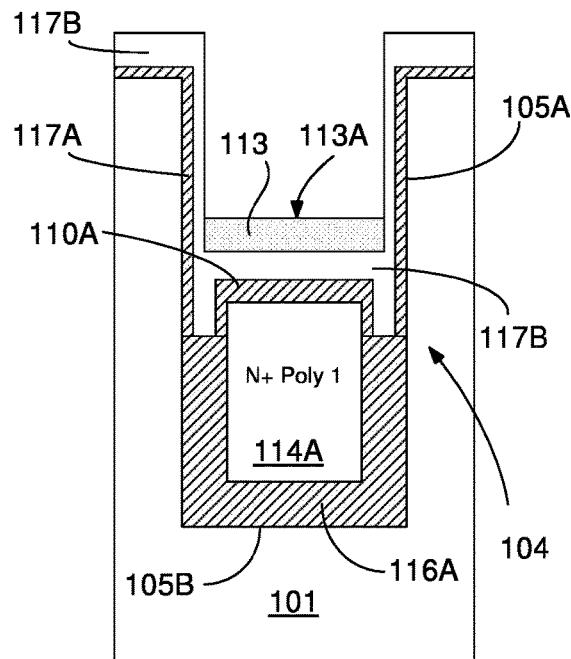
Figure 5C:
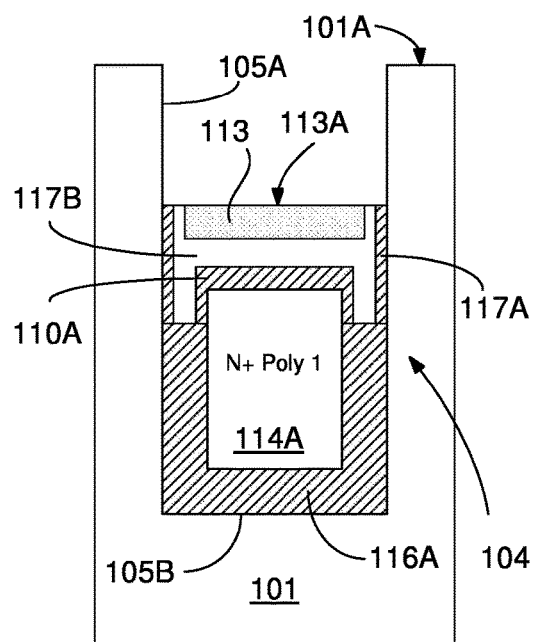

Referring to FIGS. 5B-5C, in the following process step, the photoresist material may be etched back and a portion of it over the PSO layer 110A may be reduced to a thickness range of about 100 nm to form a photoresist (PR) layer 113. The PR layer 113 is a sacrificial layer to protect the portion of the second oxide layer 117B on top of the PSO layer 110A from the etchants used to etch SiO$_2$ during the following process steps. After forming the PR layer 113, an oxide etching process may be conducted to remove the first oxide layer 117A and the second oxide layer 117B from the trench side walls 105A and the top surface 101A of the semiconductor layer 101. The oxide etching process removing the portions of the oxide layers 117A and 117B on the trench side walls 105A may expose the silicon surfaces, which extend above a top surface 113A of the PR layer 113. In this configuration, upper ends of remaining portions of the oxide layers 117A and 117B may be coplanar with the planarized surface 113A of the PR layer 113, as shown in FIG. 5C.

Figure 5D:
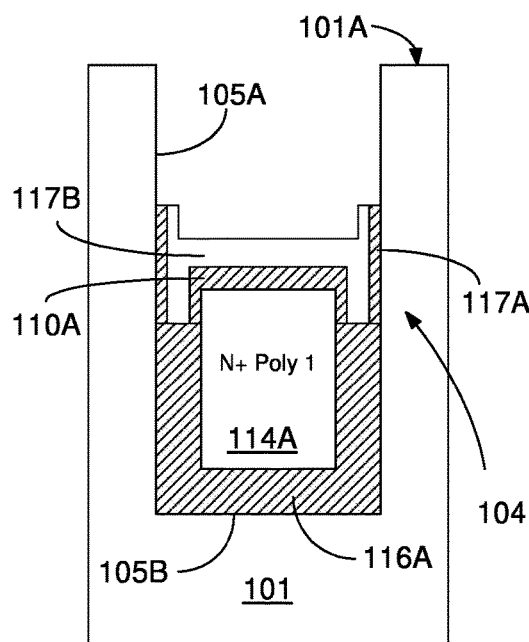

Referring to FIG. 5D, after forming the PR layer 113 and the following oxide etching process, in the next step, the PR layer 113 may be removed using a photoresist etch, which exposes the portion of the second oxide layer 117B covering the PSO layer 110A. It should be noted that the structure shown in FIG. 5D of this embodiment is also the structure shown in FIG. 4J of the previous embodiment. After FIG. 5D, the process of the present invention may continue following the same process steps as described above in the first embodiment and shown in FIG. 4K through FIG. 4N to form the IPO layer 110 and the rest of the gate trench stack 109. In this embodiment, the process of forming of the gate trench stack 109 including the IPO layer 110 of the present invention is finalized as shown in FIG. 4N.

Figure 6A:
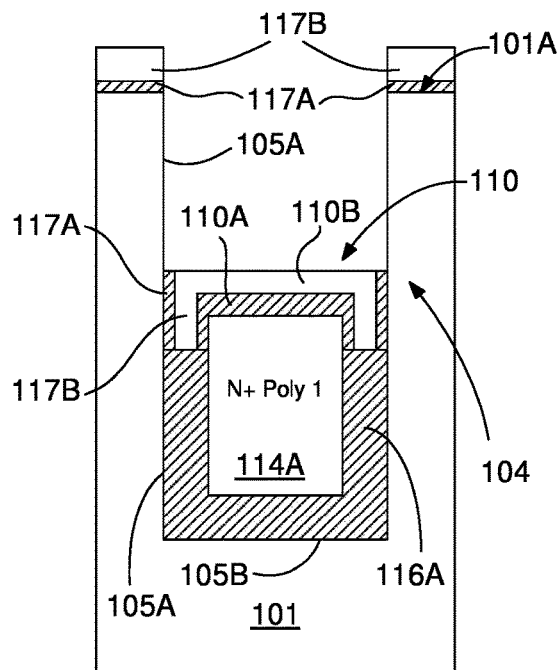
FIG. 6A-6D are schematic illustrations of another exemplary embodiment of forming the gate trench stack including IPO and gate poly silicon layers.

FIGS. 6A-6D show another alternative process embodiment of forming the gate trench stack 109 including the inter poly silicon oxide dielectric layer 110 (IPO layer) of the present invention. This embodiment may include a photoresist etch-back approach. FIG. 6A of this embodiment shows a process step after the process step shown in FIG. 4C of the first embodiment.

As previously explained in the first embodiment, the second oxide layer 117B deposited using the HDP oxide deposition process may be thicker, e.g., 5 to 6 times thicker, on the top surface 101A, or the mesa surface, and on the PSO layer 110A than the first oxide layer 117A on the trench side walls 105A or the vertical surfaces. Using this differential HDP oxide deposition process, in one embodiment, the second oxide layer 117B may have a thickness of about 100 nm over the top surface 101A while having about 20 nm thickness on the vertical surfaces of the first oxide layer 117A.

Referring to FIG. 6A, an oxide etch process may be used to remove the oxide layers 117A and 117B covering the upper portions of the side walls 105A and to reduce the thickness of the portions of the second oxide layer 117B over the top surface 101A and on top of the PSO layer 110A. The oxide etch process may be a wet etch using buffered hydrofluoric acid solution. After reducing its thickness, the portion of the second oxide layer 117B on the PSO layer 110A becomes the second layer 110B of the IPO layer 110 of the present invention, which completes the formation of IPO layer 110 of the gate trench stack 109 (FIG. 1). The PSO layer 110A and the second layer 110B may form the first film 110A and the second film 110B of the IPO layer 110 respectively as also described above.

Figure 6B:
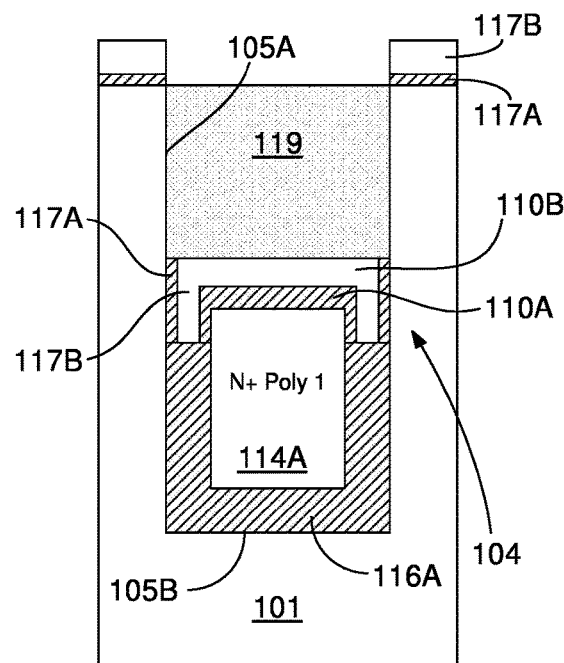

Referring to FIG. 6B, in the following step, in order to remove the remaining portions of the first and second oxide layers 117A, 117B from the top surface 101A without harming the IPO layer 110 or the trench side walls, a photoresist layer 119 may be formed over the IPO layer 110. Top surface of the photoresist layer 119 may be coplanar with the top surface 101A or kept slightly below the top surface 101A to expose the remaining portions of the first and second oxide layers 117A, 117B on the top surface 101A.

Figure 6C:
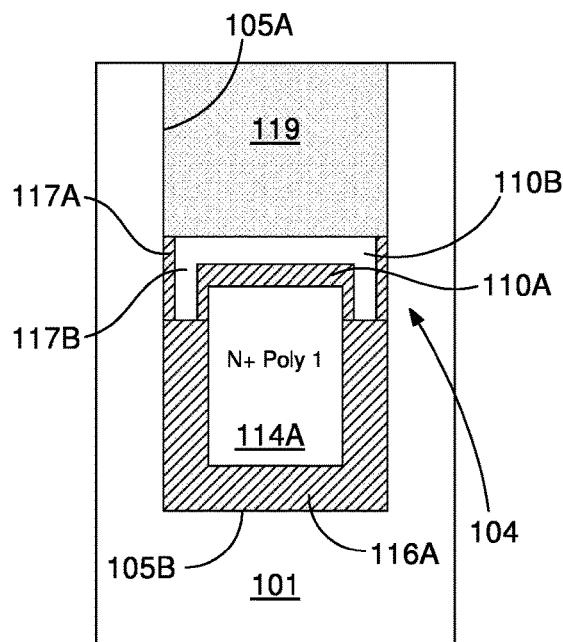

Referring to FIG. 6C, after forming the photoresist layer 119, a silicon oxide etch may be applied to remove the remaining portions of the first and second oxide layers 117A, 117B from the top surface 101A.

Figure 6D:
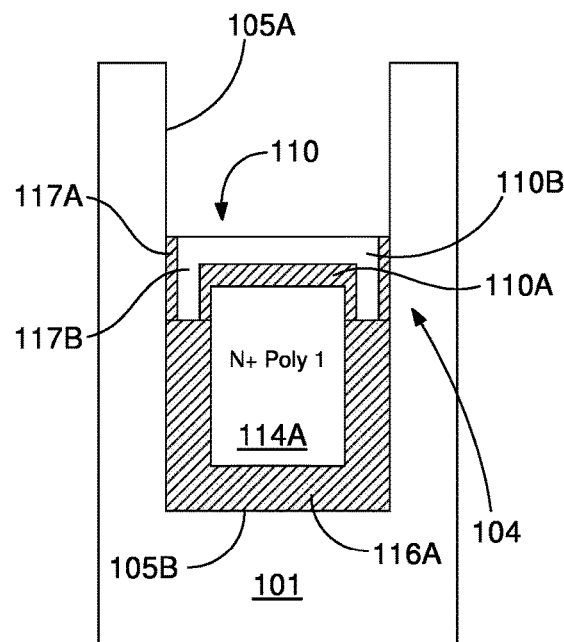

Referring to FIG. 6D, next, the photoresist layer 119 may be removed using a photoresist etch step to expose the IPO layer 110. It should be noted that the structure shown in FIG. 6D of this embodiment is also the structure shown in FIG. 4L of the first embodiment. After FIG. 6D process of the present invention continues following the same process steps as shown in FIGS. 4M-4N, and described above in the first embodiment, to form the gate trench stack 109. In this embodiment, the process of forming of the gate trench stack 109 including the IPO layer 110 of the present invention is finalized as shown in FIG. 4N.

FIGS. 7A-7F show the process steps following the formation of gate trench stacks 109 to form SGT MOSFET device structure 100 shown in FIG. 1 including the first contact region 112A (p body contact region), the source regions 120 (n+ source contact regions), contact trenches 106, dielectric layer 126, the second contact region 112B (p+ body contact region), the buffer metal layer 124, the source metal layer 122 (source electrode) and the passivation layer 128.

Figure 7A:
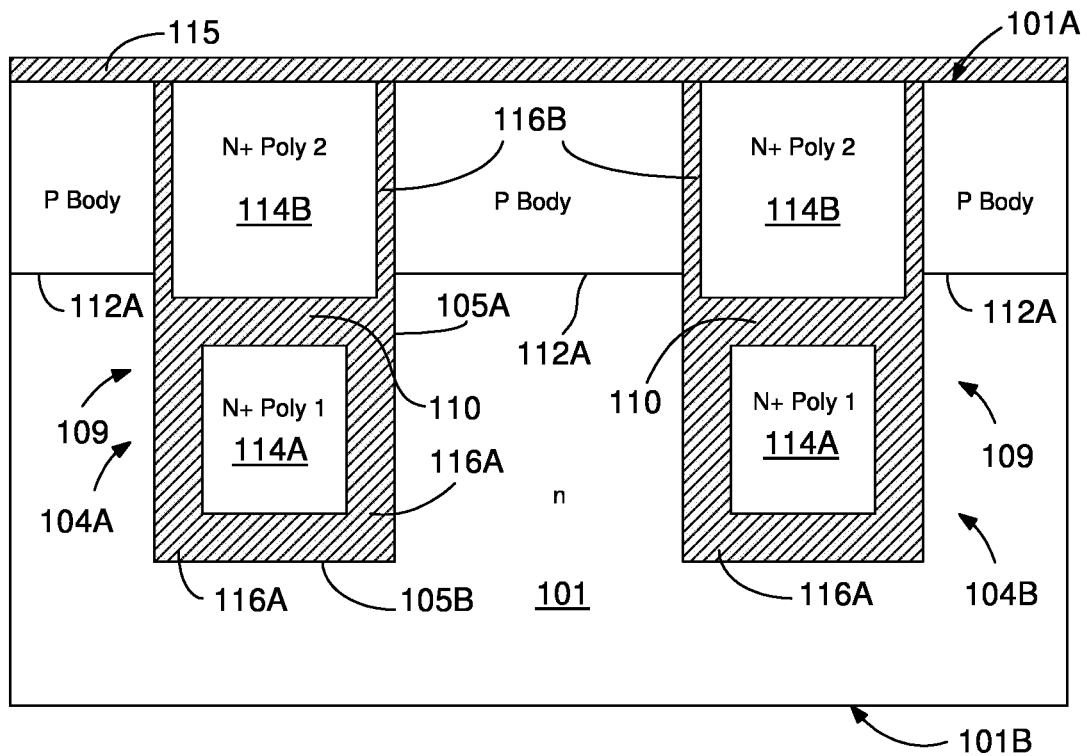
FIGS. 7A-7F are schematic illustrations of exemplary embodiment to form SGT MOSFET device structure shown in FIG. 1, following the formation of gate trench stacks.

Referring to FIG. 7A, the surface oxide layer 115, or surface layer 115. may be formed on the top surface 101A and on the second poly silicon layer 114B (gate poly silicon) in the gate trenches 104 during p body drive stage. After forming the gate trench stacks 109 in the gate trenches 104, the remainder of the gate oxide material on the top surface 101A may be etched down to make the surface oxide layer 115 having about 20-30 nm thickness, which may also act like a screen oxide layer during the following source implantations.

Next, the first p body or first contact region, 112A having p type of conductivity, may be formed by implanting p type dopants, such as boron, to the semiconductor layer 101 through the top surface 101A. A dose for this B ion implantation may be in the range of 5e12-5e13 $cm^{-2}$ to form the first contact region 112A. The first contact region 112A has a generally rectangular cross section and formed in a portion of the semiconductor layer 101 between the gate trenches 104. As explained above with respect to FIG. 1, an exemplary depth for the first contact region 112A may be in the range of about 0.3-1.0 micron.

Figure 7B:
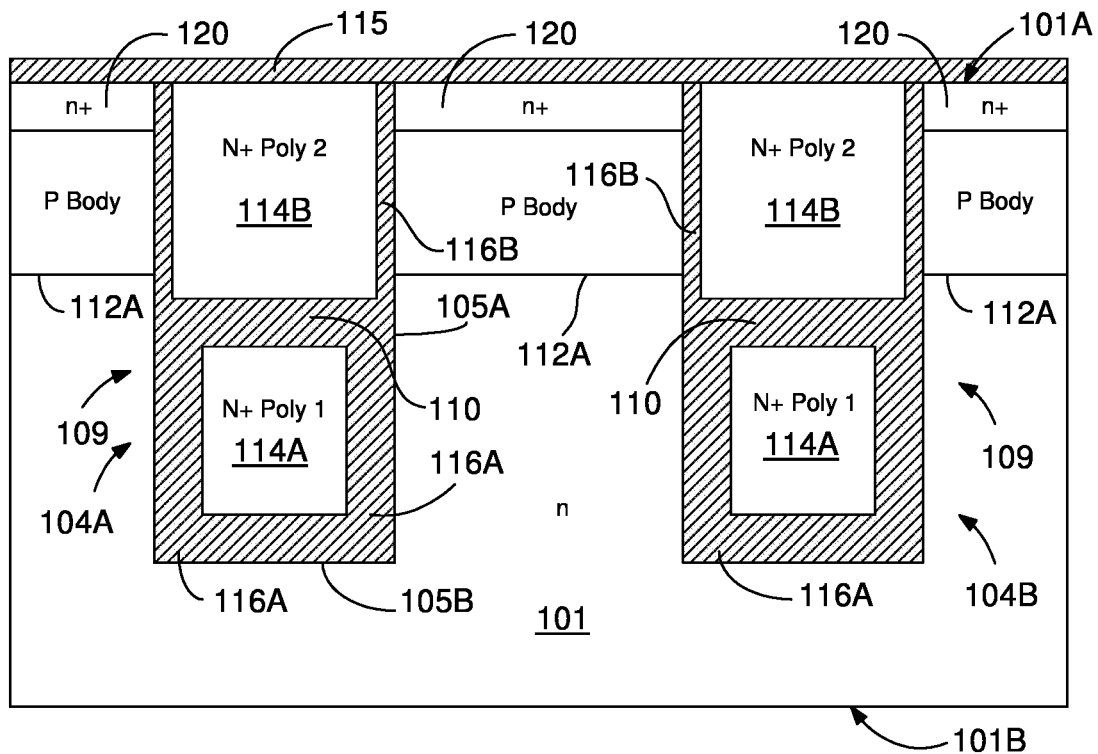

Referring to FIG. 7B, in the next process step, a fourth mask (mask 4) may be used to implant high doses of an n+ type source implant, such as P ions or As ions, to form the source regions 120 extending between the gate trenches 104. Source mask may be a photomask allowing source implant to be implanted to form the source regions 120 while blocking any implantation to other locations on the top surface 101A. A dose for the source implant may be in the range of 3E15-6E15 $cm^{-2}$ to form the n+ source regions 120.

Figure 7C:
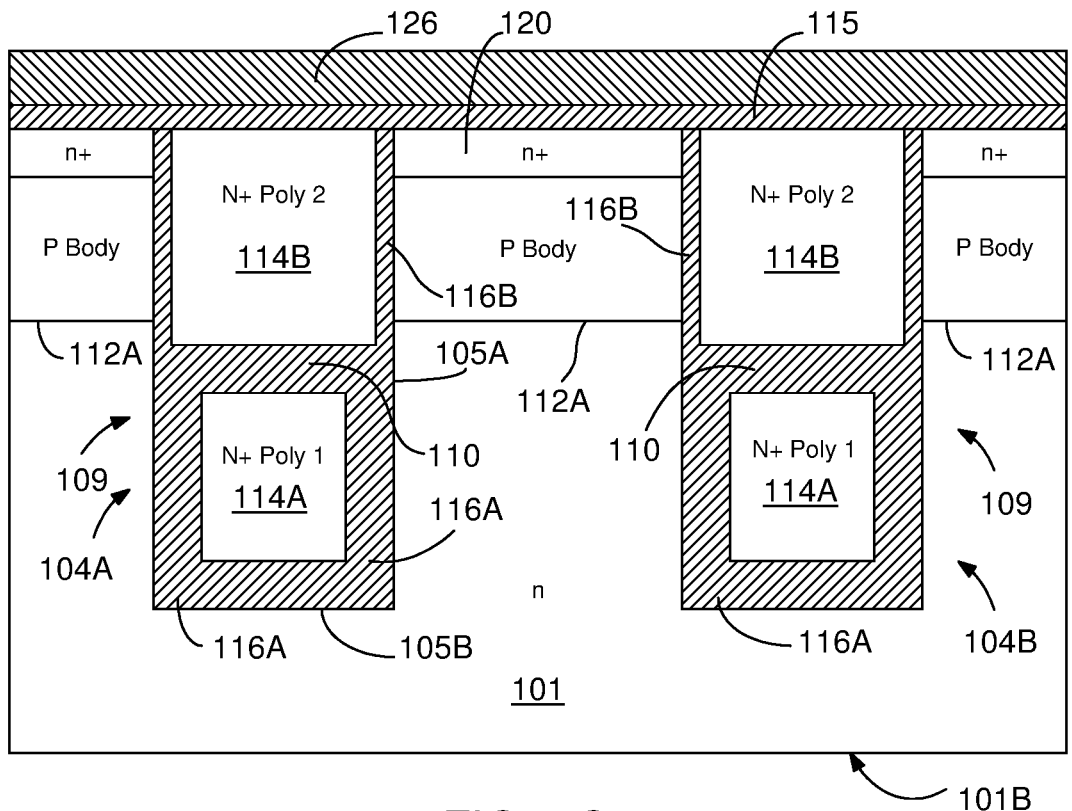

Referring to FIG. 7C, before forming the contact trenches, the dielectric layer 126 such as a composite layer including a BPSG layer and an undoped silicon oxide layer may be formed on the surface oxide layer 115. As described above the undoped oxide layer may be a diffusion barrier. The dielectric layer 126 including the undoped oxide layer and the BPSG layer may have a thickness range in the range of 0.3-1 μm. The dielectric layer 126 may also be referred to as inter layer dielectric (ILD).

Figure 7D:
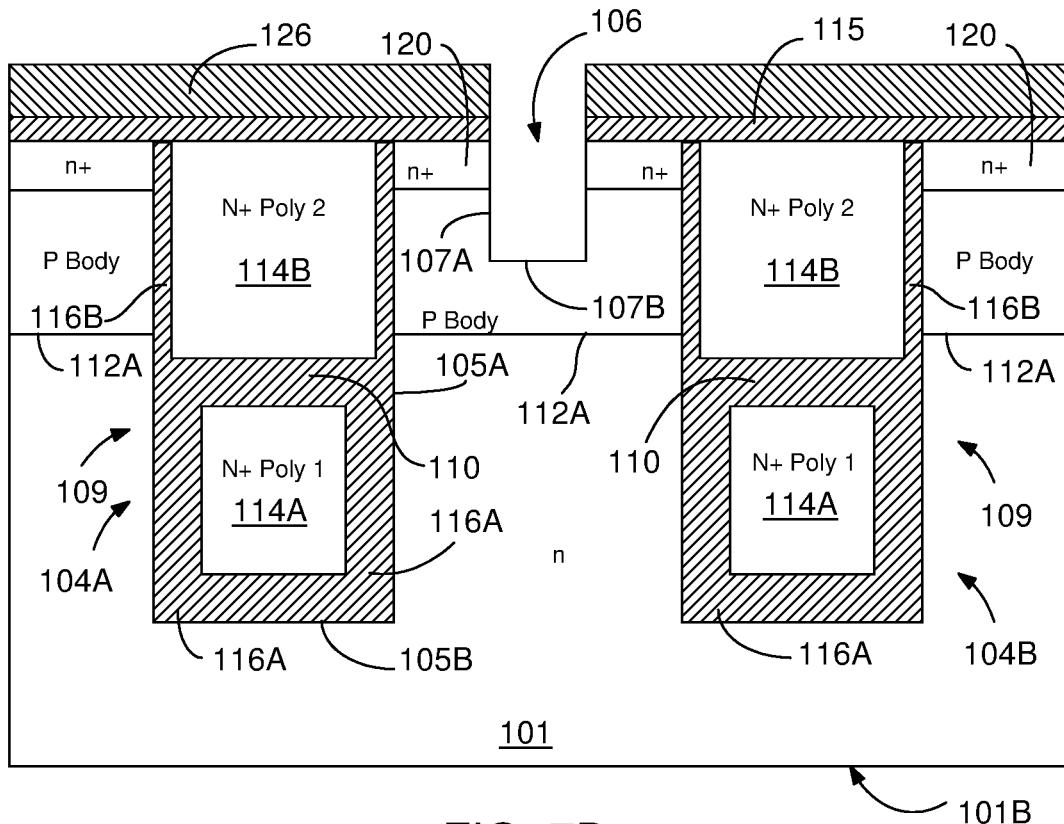

Referring to FIG. 7D, in the next process step, a fifth mask (mask 5), or contact mask, may be used to form the contact trenches 106 in the active cell region and the second contact regions 112B under the contact trenches 106. The contact mask may be applied to etch the dielectric layer 126 and the semiconductor substrate 101 to form the contact trenches 106.

Figure 7E:
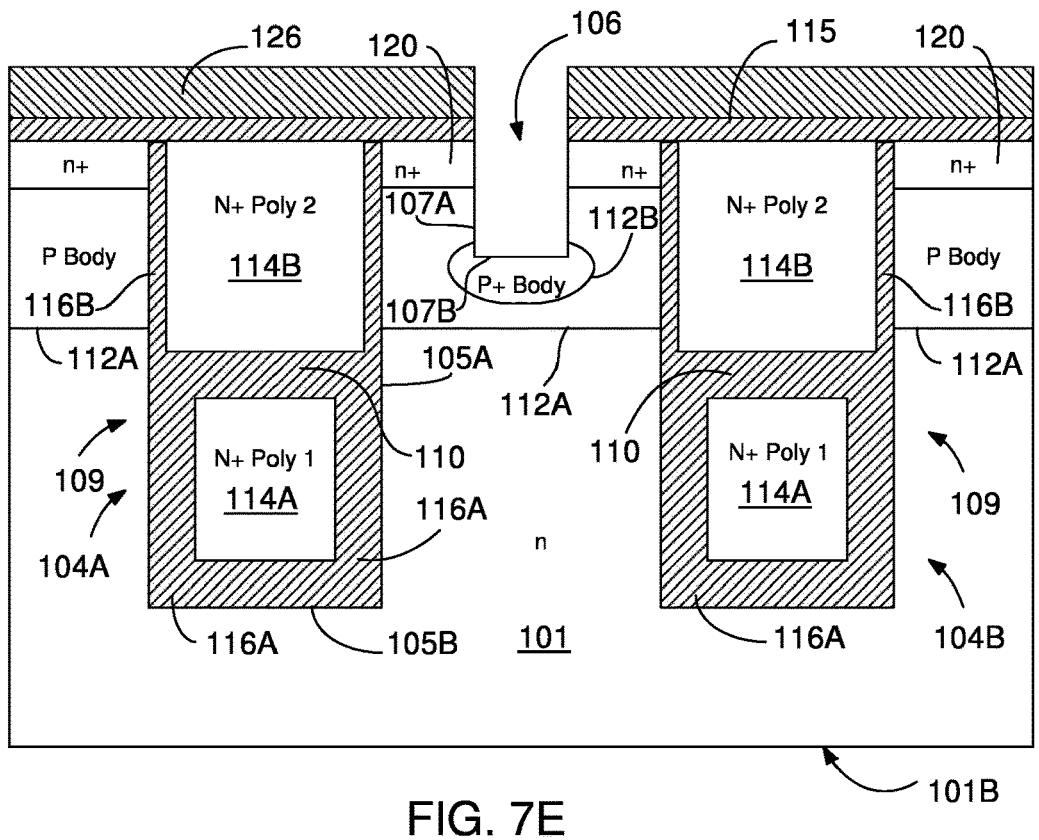

Referring to FIG. 7E, in the following process step, the second contact region 112B may be formed by implanting high doses of B or $BF_2$ ions to form the second contact region 112B under the contact trench 106. Because of the high p type dopant dose used to form the second contact regions 112B, p+ body may be used to denote the second contact regions. The p type dopant ions may be implanted through the bottom wall 107B of the contact trench 106 to form the second contact region 112B.

Figure 7F:
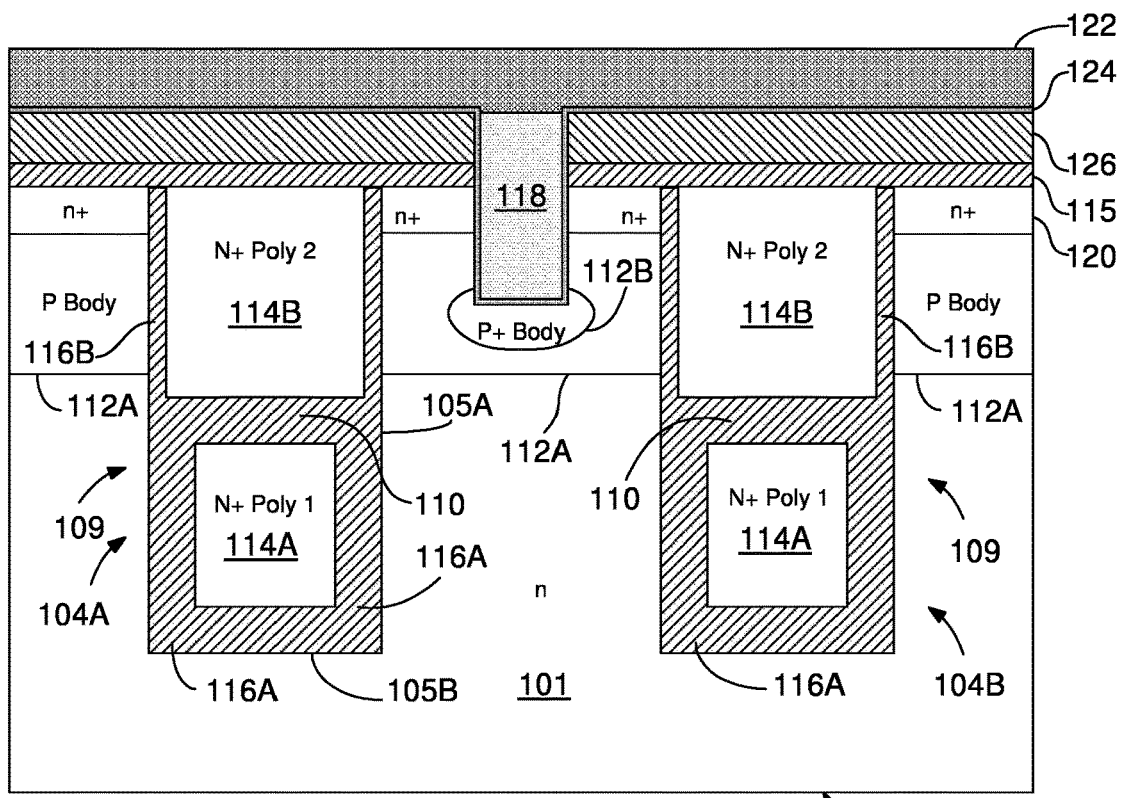

In the following process steps, the buffer metal layer 124 including Ti/TiN/W having a thickness range of about 0.1-0.2 μm may be deposited on top of the dielectric layer 126 and contact trenches 106 and other contact windows. Next, a source metal layer, Al:Cu, Al:Si or Al:Cu:Si having a thickness range of 2-8 μm may be deposited on top of the buffer metal layer 124 and etched to form source and the gate electrodes by using the metal mask (mask 6). The contact trenches 106 may include a contact material 118 including W metal as shown in FIG. 7F.

In the following step, the passivation layer 128 may be formed on the source and gate metal 122 and etched using an eighth mask (mask 8) or the passivation mask (mask 7). The passivation layer 128 may include a layer of Plasma Enhanced Chemical Vapor Deposition (PECVD) deposited $SiO_2/Si_3N_4$ layer having a thickness of about 0.8-1 μm. By utilizing the passivation mask (mask 7), the PECVD deposited $SiO_2/Si_3N_4$ layer may be removed from the source and gate pad areas. For some cases, in addition to the passivation layer, a polyimide layer may also be deposited (by spinning on). The polyimide layer may have a thickness of about 3-10 μm. The buffer metal layer 124, the source metal 122 and the passivation layer 128 may be seen in FIG. 1.

Figure 8:
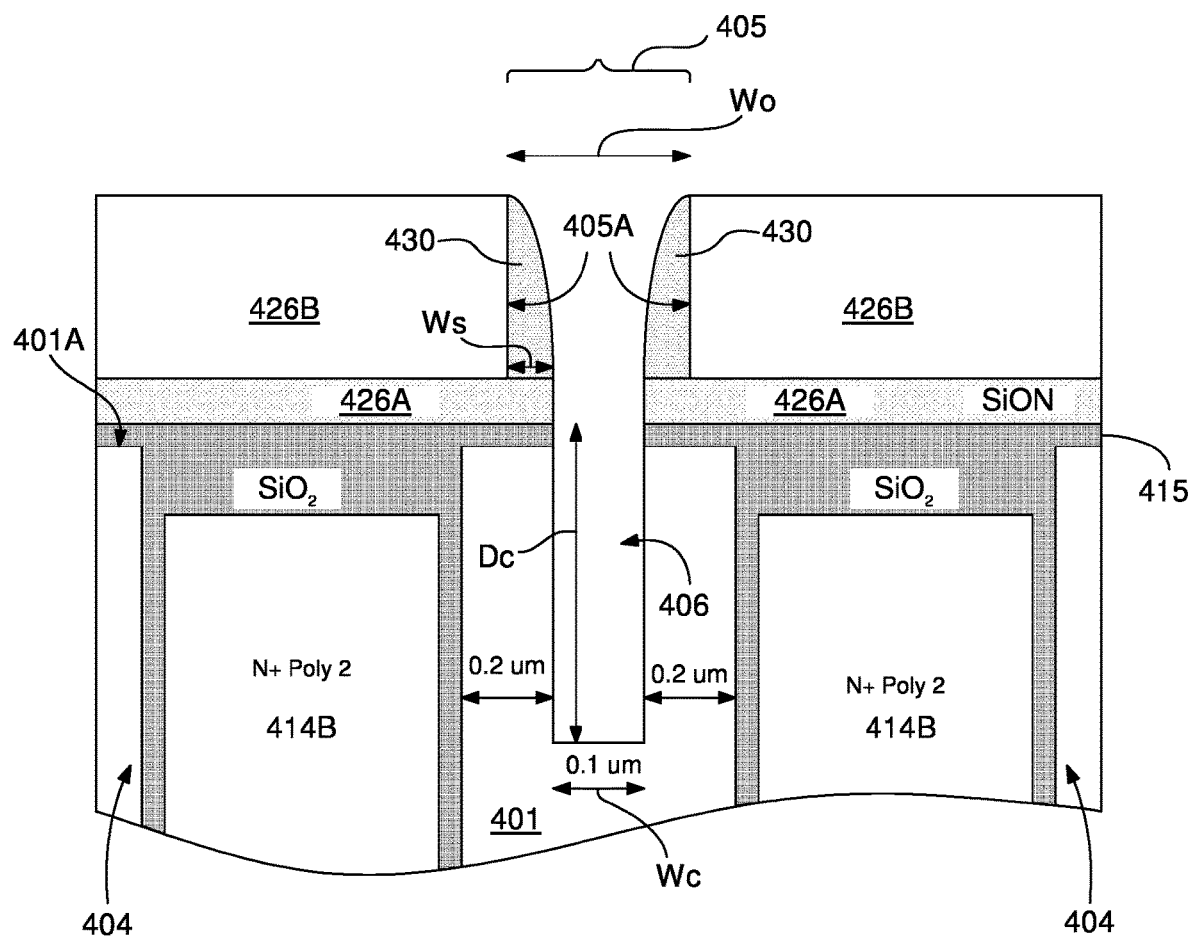
FIG. 8 is a schematic illustration of an exemplary embodiment of forming a deep and narrow contact trench.

FIG. 8 illustrates, in schematic cross-sectional view, an embodiment of forming a contact trench 406, which may be narrower or smaller than the photolithography capability of a wafer fab, by forming oxide spacers 430 on the side walls of the wider contact windows 405 in a dielectric layer 426B (BPSG layer and undoped silicon oxide layer). It is critical to form deep and narrow p body contact trenches 406 in the epi layer for the robustness of the non self-aligned contact type MOSFET devices. The contact trench 406 may be used with the embodiments described in this application.

The advantage of the present invention is that the large photoresist defined contacts, for example a 0.25 μm wide contact window, may be reduced down to, for example 0.1 μm wide contact window, by depositing dielectric layer(s) and RIE etching and forming dielectric spacers, for example about 0.075 μm wide spacers inside the large contact windows. Such contact windows are narrowed by two spacers' width compare to photoresist defined contact window. This method may be used as a contact shrinkage technique to form deep and narrow p body contact trenches.

In one embodiment of the narrow and deep contact trench forming process, after forming the n+ source regions as described in the previous embodiments, a silicon oxide layer 415 may be formed on the top surface 401A of the epitaxial silicon layer 401. A first and second dielectric layers 426A, 426B respectively may be formed on the silicon oxide layer 415. Contact windows 405 or contact openings may be formed in the second dielectric layer 426B over an area between the gate trenches 404 to form the contact trenches 406 in the following steps. By depositing silicon oxide within the contact windows 405 and RIE etching it, oxide spacers 430, having slanted surfaces, with gradually increasing in width formed along the side walls 405A of the contact windows 405 and on the first dielectric layer 426A. In the following etch process step, deep and narrow contact trenches 406 formed through the contact windows 405 having the oxide spacers 430.

An exemplary process sequence to form such narrow contact trenches according to present invention may include the steps of: (1) an oxide layer 415 deposition after forming the n+ source regions (not shown); (2) planarizing with CMP or etching back the oxide layer 415 to fill over the second poly silicon layers 414B (the thickness of the oxide layer 415 on the top surface 401A of the epitaxial layer 401 may be in the range of 100 to 200 nm); (3) depositing on the oxide layer 415, a first dielectric layer 426A, which may be SiON (silicon oxynitride) or SiN (the thickness of the first dielectric layer 426A may be in the range of 100 nm), (4) depositing and reflowing on the first dielectric layer 426A, a second dielectric layer 426B or intermetal dielectric layer, which may be a combination of BPSG and undoped silicon oxide layers, or a TEOS layer, (5) planarizing the second dielectric layer 426B, applying photoresist and using a photoresist contact mask (not shown) to form contact windows 405 in the second dielectric layer 426B with about 0.25 μm opening width Wo, (6) forming contact openings 405 in the second dielectric layer 426B (about 90 degree etching of the second dielectric layer 426B, stopping on the first dielectric layer 426A), (7) stripping photoresist mask, (8) forming a silicon oxide layer (not shown) on the second dielectric layer 426B to fill the contact windows 405 (the silicon oxide layer having a thickness in the range of about 75 nm.

(9) using Reactive Ion Etching (RIE) process, forming oxide spacers 430 within the contact windows 405, adjacent the side walls 405A, of the second dielectric layer 426B (etching process may continue to the top surface 401A of the epitaxial layer 401 beneath, and a 0.075 um wide oxide spacers (10) using a silicon etch (contact silicon etch), forming a contact trench 406 having a contact trench depth Dc of about 0.3-0.5 μm and a contact trench width Wc of about 0.1 μm at the bottom, (the contact trench width Wc at the bottom of the contact trench 406 may be adjusted with the oxide spacer width and the photoresist contact mask size), (11) forming Ti/TiN barrier metal and the W metal plug. Various depth, width and thickness values given above and shown in FIG. 8 for this embodiment are example values.

Another embodiment of the semiconductor device manufacturing method according to present invention will now be described below, with reference to FIGS. 9A-9D which illustrate only an exemplary half of a plurality of gate trenches for clarity. Each of these figures shows a process step involved in the manufacture of a reliable SGT MOSFET devices with lateral inter poly oxide (LIPO) layer located at least partially between the poly silicon layers of the gate trench stacks. In this embodiment, the LIPO layer may be located between a first poly silicon layer 214A, which may be extended to the surface where the first poly silicon layer 214A is connected to the source electrode, and a second poly silicon layer 214B. In this alternative gate trench stack structure, both the first and the second poly silicon layers within the gate trenches may extend to the surface of the epi layer and laterally separated by the lateral inter poly oxide (LIPO) layer of the present invention to complete a fully functional and reliable SGT MOSFET device. Without the LIPO layer, the SGT MOSFET device may fail due to shorting between the first and second poly silicon layers. Further, without a substantially thick LIPO layer, the SGT MOSFET device may fail high temperature gate to bias (HTGB) reliability test.

Figure 9A:
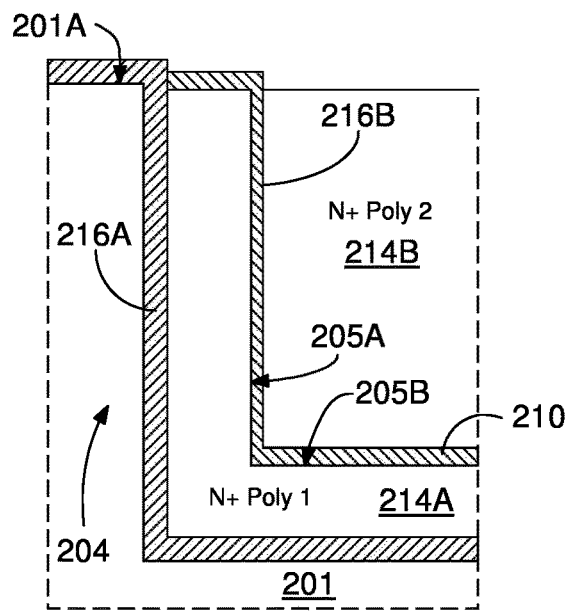
FIGS. 9A-9D are schematic illustrations of exemplary embodiment of lateral inter poly oxide (LIPO) layer located at least partially between the poly silicon layers of the gate trench stacks.

FIG. 9A shows an initial structure filling a gate trench 204 formed in an epitaxial layer 201 having a top surface 201A. The gate trench 204 may be coated with a shield layer 216A, or liner and poly silicon having n+ doping may be deposited on it, etched back and planarized to fill the gate trench lined with the shield layer. Differing from the previous embodiments, the center of the poly silicon filling the gate trench 204 may be further partially etched and removed to form a first poly silicon layer 214A that is conformally coating the gate trench 204. In this configuration the first poly silicon layer 214A extends to the top surface 201A of the epitaxial layer 201.

A gate oxide layer 216B may coat the side walls 205A and top of the first polysilicon layer 214A. The gate oxide 216B may be formed using thermal oxidation. An inter poly oxide (IPO) layer 210, or lateral IPO (LIPO) layer 210, may coat a top wall 205B of the first polysilicon layer 214A. The IPO layer 210 may be formed using thermal oxidation and HDP oxide deposition process. A second poly silicon layer 214B may be formed by depositing poly silicon material having n+ doping onto the gate oxide layer 216B and the IPO layer 210 lining the cavity of the first poly silicon layer 214A. IPO layer thickness may range from about 1.5 to about 2.5 times the gate oxide thickness.

Figure 9B:
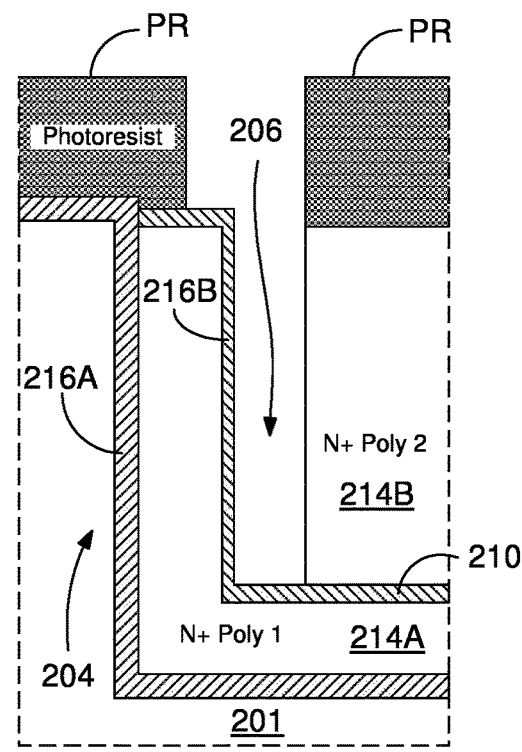
Figure 9C:
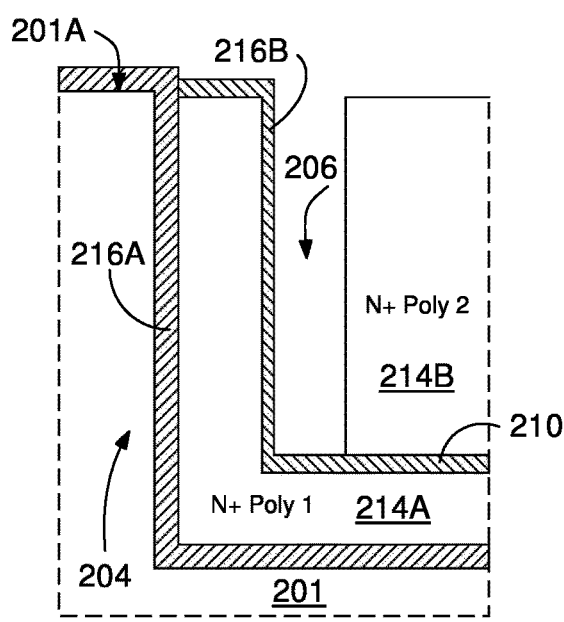

As shown in FIGS. 9B-9C, in the following step, the thickness of the second poly silicon layer 214B may be first etched back to a predetermined thickness, and next patterned using a photoresist mask PR (poly 2 mask) to form a gap 206 by applying a wet or dry poly silicon etch. The gap 206 may vertically extend along the gate oxide layer 216B to separate the second poly silicon layer 214B from the vertical portions of both the gate oxide layer 216B and the first poly silicon layer 214A. The gap 206 may have a width in the range of about 1 μm.

Figure 9D:
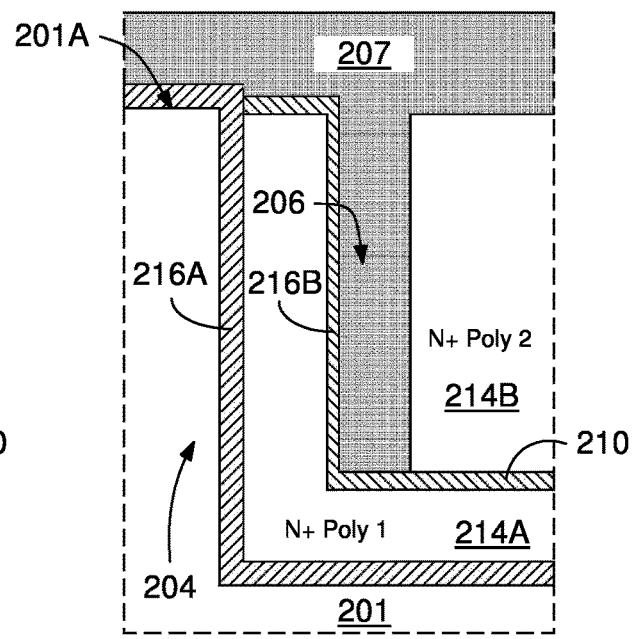

As shown in FIG. 9D, after forming the gap 206, a dielectric layer 207 may be deposited on the epitaxial layer 201. The dielectric layer 207 fills the gap 206 and forms a lateral inter poly layer between the vertical portions of the first and second poly silicon layers 214A and 214B. In one embodiment the dielectric layer 207 filling the gap 206 may be BPSG or TEOS (tetraethyl orthosilicate).

Figure 10A:
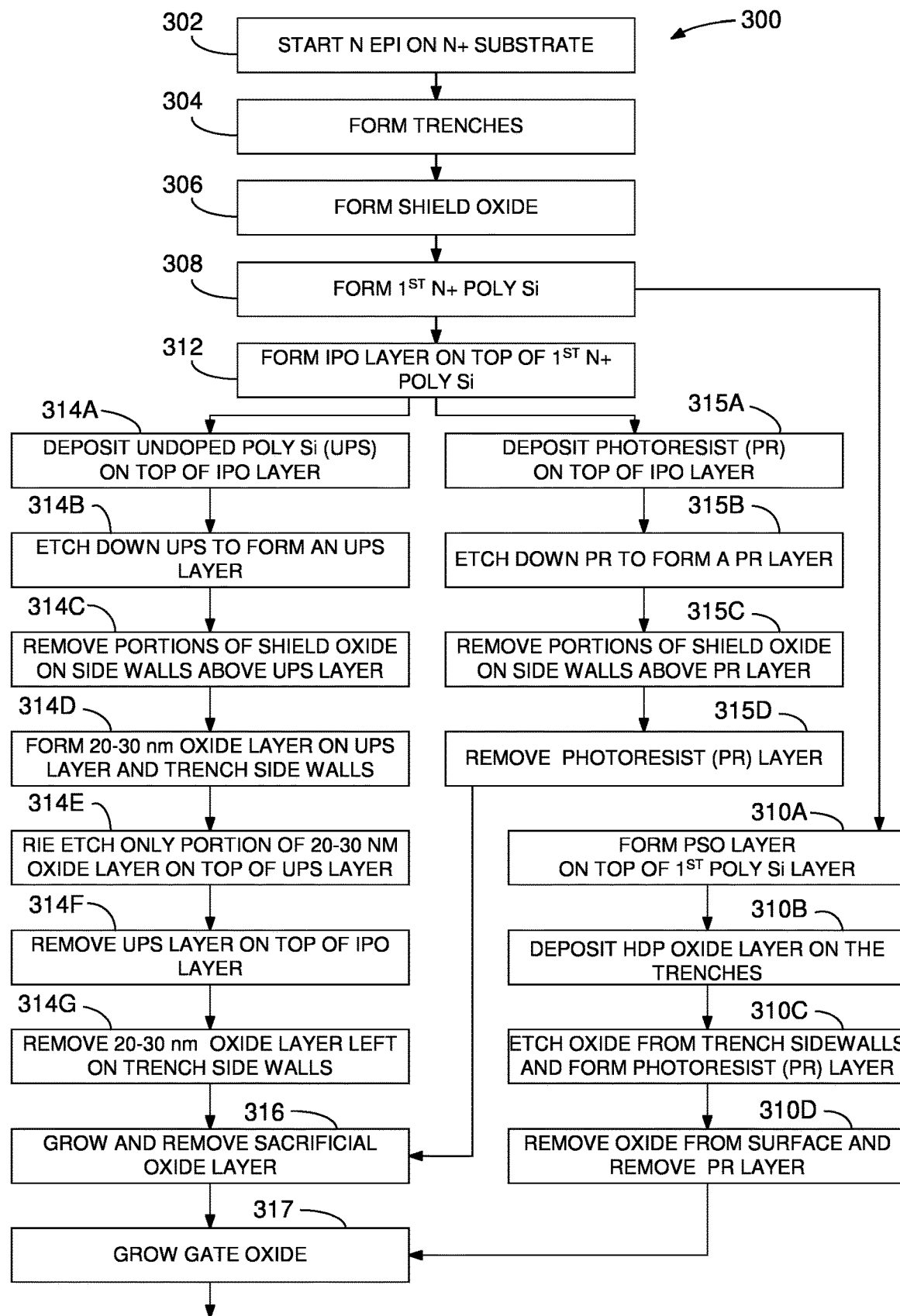
FIGS. 10A-10B show a flowchart including process embodiments of the present invention.
Figure 10B:
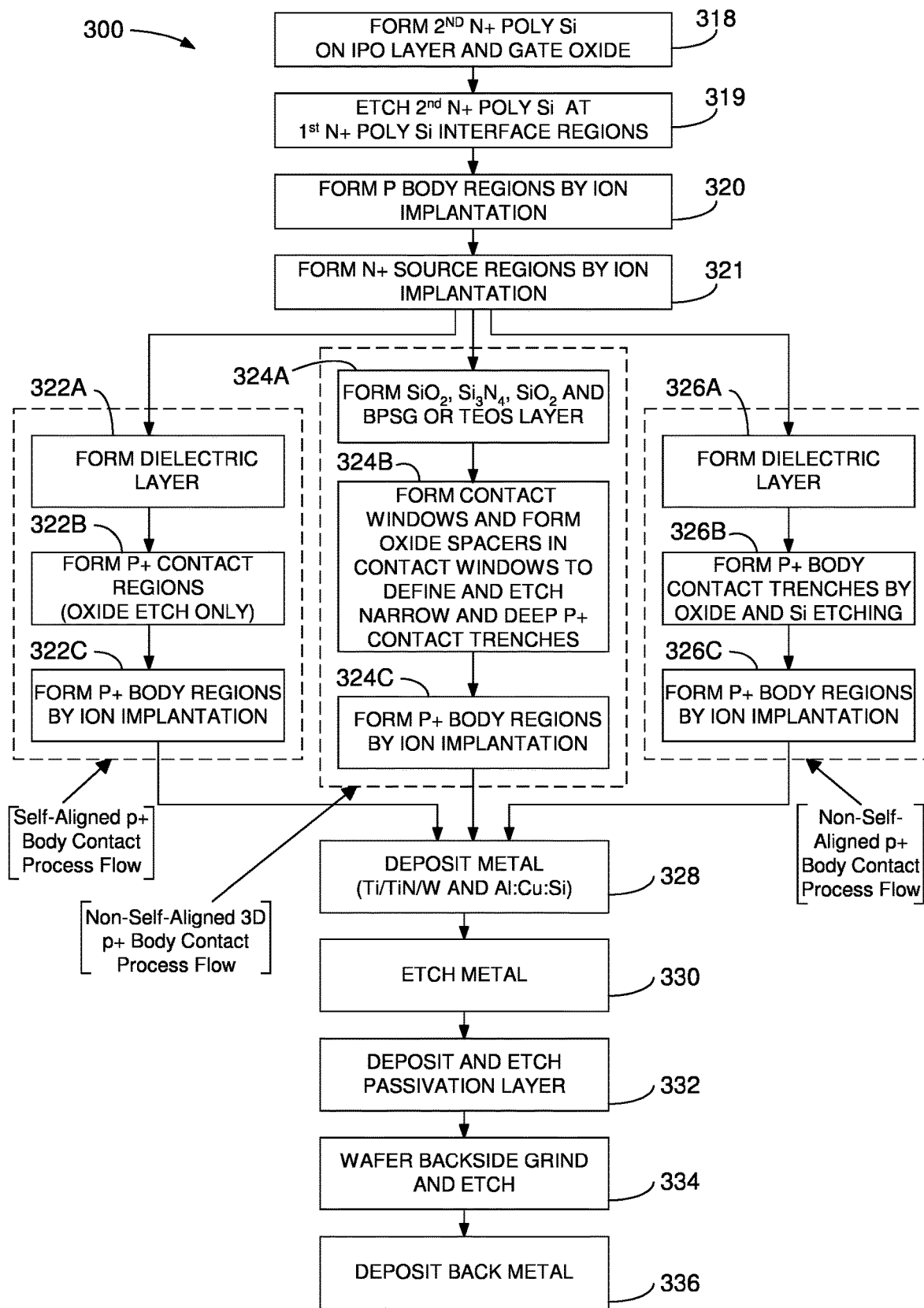

Flowcharts in FIGS. 10A-10B show an exemplary process flow embodiment 300 of the present invention. FIG. 10B is continuation of FIG. 10A. Referring to FIG. 10A, and collectively to the figures, in one embodiment, in step 302, starting wafer may include an n silicon epitaxial layer (n epi layer) grown on an n+ silicon substrate.

In step 304, gate trenches (and optionally in some embodiments) may be formed in the n epi layer. In step 306, a shield oxide layer ($SiO_2$) may be formed on trench side walls and bottom walls of the gate trenches. The shield oxide layer may preferably be grown on the silicon side walls and bottom walls. In step 308, a first n+ poly Si layer (first doped poly Si layer) formed within a lower half of the trench cavity which is entirely coated with the shield oxide layer formed in step 306. In step 312, an inter poly silicon dielectric layer (IPO layer) may be formed on top of the first n+ poly Si layer. The IPO layer may include a poly silicon oxide (PSO) layer and an HDP deposited silicon oxide layer. In one embodiment, the IPO layer may have a thickness of about 1.5 to 2 times the thickness of the gate oxide layer formed in step 316.

Following step 312, in step 314A, undoped poly Si (UPS) may be deposited on the IPO layer. In step 314B, the undoped poly silicon is etched down to form the UPS layer. In step 314C, exposed portions of the shield oxide layer on the side walls of the gate trench are removed. In step 314D, a silicon oxide layer, having a thickness of 20-30 nm, is formed on the UPS layer and on the exposed portions of the trench side walls. In step 314E, using RIE process, a portion of the silicon oxide layer on top of the UPS layer is removed. In step 314F, the UPS layer on the IPO layer is removed to expose the IPO layer. In step 314G, reminders of the silicon oxide layer left on the trench side walls are removed.

In an alternative process embodiment sequence, after step 312, in step 315A, photoresist may be deposited on the IPO layer. In step 315B, the photoresist is etched down to form the photoresist layer (PR). In step 315C, exposed portions of the shield oxide layer on the side walls of the gate trench are removed. In step 315D, the photoresist layer on top of the IPO layer is removed to expose the IPO layer.

In another alternative process embodiment sequence, after step 308, in step 310A, a poly silicon oxide layer (PSO layer) may be grown on the first n+ poly Si layer. In step 310B, a silicon oxide layer is deposited by HDP oxide deposition process. In step 310C, the silicon oxide layer is etched from the side walls to form the IPO layer. A photoresist (PR) layer is formed on the IPO layer. In step 310D, remaining oxide layer portions on top of the n epi layer surface (mesa) are etched while the structures in the trench are protected by the photoresist layer, and the photoresist layer on top of the IPO layer is removed to expose the IPO layer.

After either following the process sequence through steps 314A-314G or steps 315A-315D, in step 316, a sacrificial oxide layer is grown on the side walls of the gate trenches and on the top surface (mesa), and the sacrificial oxide layer is subsequently removed. In step 317, the gate oxide layer of about 10-150 nm may be grown on the on the exposed silicon side walls of the upper portion of the trench cavity. The process sequence including steps 310A-310D may also continue with step 317 forming the gate oxide.

Referring to FIG. 10B, and collectively to the figures, in one embodiment, after growing the gate oxide of the gate trench stacks in step 317 in FIG. 10A, in step 318, a second n+ poly Si layer formed within the upper half of the trench cavity and on the IPO layer. This step completes the structure of the gate trench stack. Next, in step 319, in certain regions of the wafer where the first n+ poly Si layer extends to the top surface of the n epi layer at an interface of the first n+ poly Si layer and the second n+ poly Si layer, the second n+ poly Si layer is etched from the top surface down to the IPO layer. The gap created after the etching of the second n+ poly Si may be filled with a dielectric layer including one of silicon oxide, undoped silicon oxide and BPSG, undoped silicon oxide and PSG, or undoped silicon oxide and TEOS. The dielectric layer may be formed at the interface of the first n+ poly Si and the second n+ poly Si. In steps 320 and 321, p body regions and n+ source regions may be formed by implanting p type dopants and n type dopants, respectively, at the top surface of the silicon layer and between the gate trenches.

After step 321, in one embodiment, self-aligned p+ body regions may be formed by conducting the process steps 322A-322C. In step 322A, a dielectric layer such as a BPSG layer, or an undoped silicon oxide layer and a BPSG layer, may be formed on top surface of the n epi layer. Next, in step 322B, a silicon oxide etching is applied to remove the silicon oxide filling the previously formed contact trenches, and in the following step 322C, p+ body regions may be formed by implanting p type dopants through the contact trenches. The contact trenches in this embodiment using the steps 322A-322C may be previously formed along the gate trenches and filled with a silicon oxide plug to protect it.

In another embodiment, after step 321, non self-aligned stripe or rectangular p+ body contact regions, and deeper and narrower p+ body contact trenches, may be formed by conducting the process steps 324A-324C. This process flow is possible when only the gate trenches are formed in step 304 but not the contact trenches.

In step 324A, a dielectric layer such as at least of one of a silicon oxide layer, an undoped silicon oxide layer and a nitride layer, an undoped silicon oxide layer and a BPSG layer, or an undoped silicon oxide layer and a TEOS layer may be formed on top of n epi layer. In step 324B, deeper and narrower p+ body contact trenches may be formed. Such contact trenches may be made narrower and deeper, than the ones defined by the minimum feature size of photolithography, by narrowing the contact windows of the contact mask, such as BPSG layer or TEOS layer, using oxide spacers formed inside the contact windows. After the spacer formation, final p body contact trench width may shrink down about twice the spacer width compared to the photoresist defined contact width. In step 324C, B or $BF_2$ ions may be implanted to form p+ body regions.

In another embodiment, after step 321, non self-aligned p+ body contact regions may be formed by conducting the following process steps. This particular process flow is also only possible when only the gate trenches are formed in step 304 but not the contact trenches. Accordingly, in step 326A, a dielectric layer such as an undoped silicon oxide layer and a BPSG layer, or a BPSG layer, may be formed on top surface of the n epi layer. In step 326B, contact trenches may be formed between the gate trenches by utilizing a silicon oxide etching first, followed by a silicon etching. In step 326C, p+ body regions may be formed by implanting p type dopants through the contact trenches.

After selecting one of the process sequences shown through steps 322A-322C, steps 324A-324C, and steps 326A-326C, in step 328, the metal layer including Ti/TiN/W and Al:Si:Cu, or Al:Cu or Al:Si may be deposited on the dielectric layer. In step 330, the metal layer may be etched. In step 332, a passivation layer may be deposited and etched. In step 334, wafer backside may be ground and etched. Next, in step 336, back metal layer may be deposited on the backside.

Although aspects and advantages of the present invention are described herein with respect to certain embodiments, modifications of the embodiments will be apparent to those skilled in the art. Thus, the scope of the present invention should not be limited to the foregoing discussion, but should be defined by the appended claims.

We claim:

1. A method for forming shielded gate trench MOS devices, including:
 providing a silicon layer having a first type conductivity overlying a semiconductor substrate;
 forming, on a front surface of the silicon layer, an array of a plurality of gate trenches in an active region of the front surface, the gate trenches extending orthogonally from the front surface toward the semiconductor substrate; and
 forming in each gate trench a gate trench stack including:
  forming a shield layer lining side walls and bottom wall of each gate trench, wherein shield layer is silicon oxide;
  forming a first doped poly silicon layer on a portion of the shield layer lining the bottom wall and lower portions of the side walls of the gate trench;
  removing upper portions of the shield layer to expose upper portions of the side walls;
  forming an inter poly oxide (IPO) layer including a poly silicon oxide film, on top of the first doped poly silicon layer by a thermal oxide growth process, wherein forming of the IPO layer results in forming silicon oxide layer on upper portions of the side walls;
  depositing a high density plasma (HDP) oxide layer on the oxide layer and the IPO layer to further thicken IPO layer, wherein a thickness ratio of the HDP oxide layer on the side walls to on the IPO layer is about 1/5;

removing the HDP oxide and the silicon oxide from the trench side walls using wet etching while retaining the HDP oxide over the IPO layer and portions of the HDP oxide layer and the silicon oxide layer on the front surface;

forming a photoresist layer by filling cavity above the IPO layer;

etching back the photoresist layer immediately below the front surface to expose the portions of the HDP oxide layer and the silicon oxide layer on the front surface;

removing the portions of the HDP oxide layer and the silicon oxide layer from the front surface and subsequently removing the photoresist layer to expose the IPO layer;

growing a gate oxide layer on the upper portions of the side walls; and forming a second doped poly silicon layer, on the gate oxide layer and the IPO layer, filling the gate trench.

2. The method of claim 1 further comprising, first type conductivity is n type and second type conductivity is p type.

3. The method of claim 1 further comprising, on the front surface of the silicon layer, forming p body contact trenches between the gate trenches, the p body contact trenches extending orthogonally from the front surface toward the semiconductor substrate.

4. The method of claim 1 further comprising, on the front surface of the silicon layer, forming p body contact trenches between the gate trenches using a separate contact mask, the p body contact trenches extending orthogonally from the front surface toward the semiconductor substrate.

5. The method of claim 1 further comprising n+ semiconductor as substrate to form a trench power MOSFET.

6. The method of claim 1 further comprising, p+ semiconductor as substrate to form a trench insulated gate bipolar transistor (IGBT).

* * * * *